(12) United States Patent
Hatanaka et al.

(10) Patent No.: US 8,367,542 B2
(45) Date of Patent: Feb. 5, 2013

(54) SEMICONDUCTOR DEVICE MANUFACTURING METHOD AND SEMICONDUCTOR DEVICE MANUFACTURING APPARATUS

(75) Inventors: Masanobu Hatanaka, Susono (JP); Kanako Tsumagari, Susono (JP); Michio Ishikawa, Susono (JP)

(73) Assignee: ULVAC, Inc., Chigasaki-shi, Kanagawa (JP)

( * ) Notice: Subject to any disclaimer, the term of this patent is extended or adjusted under 35 U.S.C. 154(b) by 0 days.

(21) Appl. No.: 13/273,612

(22) Filed: Oct. 14, 2011

(65) Prior Publication Data

US 2012/0031650 A1     Feb. 9, 2012

Related U.S. Application Data

(62) Division of application No. 12/528,811, filed as application No. PCT/JP2008/053163 on Feb. 25, 2008, now Pat. No. 8,043,963.

(30) Foreign Application Priority Data

Feb. 27, 2007  (JP) ................................ 2007-047944
Feb. 27, 2007  (JP) ................................ 2007-048065

(51) Int. Cl.
    *H01L 21/4763* (2006.01)
(52) U.S. Cl. ........ 438/639; 438/627; 438/637; 438/785; 257/E21.584
(58) Field of Classification Search .................. 438/622, 438/627, 637, 639, 785
    See application file for complete search history.

(56) References Cited

U.S. PATENT DOCUMENTS

| 4,239,536 | A  | 12/1980 | Yamamoto et al. |
| 4,668,538 | A  | 5/1987  | Feichtner et al. |
| 6,750,541 | B2 | 6/2004  | Ohtsuka et al. |
| 2004/0188735 | A1 | 9/2004 | Hideki |
| 2004/0188839 | A1 | 9/2004 | Ohtsuka et al. |
| 2006/0113675 | A1* | 6/2006 | Chang et al. .......... 257/763 |
| 2006/0231017 | A1 | 10/2006 | Vaartstra |
| 2010/0068891 | A1 | 3/2010 | Hatanaka et al. |

FOREIGN PATENT DOCUMENTS

| JP | 2002-043315 | 2/2002 |
| JP | 2003-017496 | 1/2003 |
| JP | 2004-006856 | 1/2004 |
| JP | 2004-259753 | 9/2004 |
| JP | 2006-009144 | 1/2006 |
| JP | 2006-057162 | 3/2006 |
| WO | 2004/055235 | 7/2004 |
| WO | 2008/056742 | 5/2008 |

* cited by examiner

*Primary Examiner* — Alexander Ghyka
(74) *Attorney, Agent, or Firm* — Novak Druce Connolly Bove + Quigg LLP

(57) ABSTRACT

A method for manufacturing a semiconductor device that improves the reliability of a metal cap layer and productivity. The method includes an insulation layer step of superimposing an insulation layer(11) on a semiconductor substrate (2) including an element region (2b), a recess step of forming a recess (12) in the insulation layer (11), a metal layer step of embedding a metal layer (13) in the recess (12), a planarization step of planarizing a surface of the insulation layer (11) and a surface of the metal layer (13) to be substantially flush with each other, and a metal cap layer step of forming a metal cap layer (16) containing at least zirconium element and nitrogen element on the surface of the insulation layer (11) and the surface of the metal layer (13) after the planarization step.

8 Claims, 11 Drawing Sheets

SEMICONDUCTOR DEVICE MANUFACTURING METHOD AND SEMICONDUCTOR DEVICE MANUFACTURING APPARATUS

CROSS-REFERENCE TO RELATED APPLICATIONS

This application is a Divisional of 12/528,811 filed Aug. 27, 2009, which is a U.S. §371 national stage entry of International Application No. PCT/JP2008/0053163, filed Feb. 25, 2008, which claims priority to Japanese Patent Application No. 2007-047944, filed Feb. 27, 2007 and Japanese Patent Application No. 2007-048065, filed Feb. 27, 2007, all of which are hereby incorporated by reference.

TECHNICAL FIELD

The present invention relates to a method for manufacturing semiconductor devices and an apparatus for manufacturing semiconductor devices.

BACKGROUND ART

The progress in miniaturization and multi-layering of semiconductor devices has increased current density, which has resulted in serious electromigration (EM). Multilayer wiring techniques using copper (Cu), which has a high EM resistance, is thus essential for higher integration of semiconductor devices.

A process for manufacturing Cu wires uses a so-called Damascene process, which preforms trenches in an insulation layer in correspondence with a wiring pattern and then forms wires by filling the trenches with Cu. The process for manufacturing Cu wires also uses a so-called Dual-Damascene process, which preforms via holes in wiring trenches and then simultaneously forms wires and via contacts by filling Cu into both of the trenches and the via holes.

On the Cu wires subsequent to the Damascene process, a cap layer SiC, SiN, or the like is arranged between the Cu wires and the insulation layer (e.g., low permittivity film: Low-k film), which is arranged on the Cu wires. The cap layer functions as an oxidation resistant film on surfaces of the Cu wires, a diffusion resistant film for Cu, and an etching stop film for the via holes. The adhesion of the cap layer including the insulation film of SiC, SiN, or the like with the Cu wires is weak. This lowers the reliability of the Cu wires. Furthermore, the cap layer causes the etching of the via holes to become complicated and thereby lowers the productivity of the semiconductor device.

To solve this problem, in the prior art, a Cu multilayer wiring technique using a metal material for the cap layer on Cu wires has been proposed. The cap layer formed from a metal material (hereinafter simply referred to as a metal cap layer) must have a high adhesiveness with respect to the Cu wires, a low specific resistance, and high barrier properties (high barrier properties with respect to moisture from the Low-k film and Cu atoms from the Cu wires), and selectivity so that the cap layer is formed on only the Cu wires.

Patent document 1 uses an electroless plating process to selectively deposit cobalt-tungsten phosphide (CoWP) on a Cu wire surface and form a metal cap layer on the surface of the CoWP layer through a salicide process. This satisfies the adhesiveness, conductivity, barrier properties, and film-formation selectivity required for the metal cap layer and improves the oxidation resistance of the metal cap layer.

Patent document 2 forms a metal cap layer on the entire surface of a substrate including Cu wires by using zirconium nitride, zirconium nitride compounds, or the like for the material of the metal cap layer. Zirconium nitride and zirconium nitride compound selectively provide conductivity only on the Cu wiring. This produces the functions of a metal cap layer without the need for film-formation selectivity.

However, patent document 1 uses an electroless plating process to obtain the film-formation selectivity. In the electroless plating process, the shape and film thickness of the CoWP layer are greatly affected by the concentration of chemicals, the oxidation-reduction atmosphere, and the like. As a result, the deposition state of CoWP greatly fluctuates in accordance with the coarseness/denseness, surface area, shape, etc. of the Cu wires. This leads to short-circuiting between adjacent CoWP layers and covering failures of the Cu wires.

Further, in the electroless plating process, the surface that is immersed in chemicals, such as the surface of the Cu wires subsequent to the Damascenes process and the surface of the Low-k film, must be extremely clean to realize film-formation selectivity. This increases the number of surface treatment steps involved in cleaning and thereby lowers the productivity of the semiconductor device.

Patent document 2 only discloses a manufacturing method related to zirconium nitride (ZrN) using tetrakis-diethylamino-zirconium (TDEAZ) and does not disclose the raw materials, conditions, and the like for a manufacturing method related to zirconium nitride compound. Moreover, the inventors of the present application has conducted experiments and have found that in a ZrN film formation process using TDEAZ, a large amount of powder-like ZrN and byproducts are simultaneously generated and a sufficient particle level is difficult to obtain when manufacturing semiconductor devices. The powder-like ZrN and by-products accumulate in a supply system and discharge system for raw material gas and thereby interfere with stable operation of the manufacturing apparatus. Therefore, there is a demand for a manufacturing apparatus and manufacturing method for semiconductor devices that improve the reliability and productivity of the metal cap layer.

Furthermore, the demand has recently been increasing for microfabrication is accelerating in for thin film manufacturing techniques in the semiconductor field. This has raised various problems.

For example, copper is often used as wiring material due to reasons such as the resistivity being small and electromigration being less likely to occur. However, copper is difficult to etch and has a property of easily diffusing in an underlayer (silicon dioxide film). This lowers the reliability of the device.

In order to solve such problem, a barrier film is formed through CVD process or the like on an inner wall surface of an inter-multilayer connection hole in a multilayer wiring structure, and a copper thin film is formed thereon as a wiring layer. As a result, the copper thin film and the underlayer (silicon dioxide film) do not come into direct contact. This prevents the diffusion of copper. Ta (tantalum) film is known as such a barrier film (see e.g., patent document 3).

FIGS. 18(a) to 18(e) are cross-sectional views showing one example of a process for forming a multilayer wiring structure using a Ta film as the barrier film.

Referring to FIG. 18(a), elements such as a transistor are formed on a substrate 200, which is a film formation subject. On the substrate 200, a first wire Cu film 251, a cap layer 252 formed to have a film thickness of about 10 to 30 nm, a first silicon dioxide film 253 functioning as an interlayer insulation film formed to have a film thickness of about 300 to 1000 nm, a tantalum nitride film 254 functioning as an etching stop film when a wire groove is etched and formed to a have a film thickness of about 30 to 200 nm, and a second silicon dioxide film 255 functioning as a second interlayer insulation film and formed to have a film thickness of about 300 to 1000 nm are sequentially superimposed.

Each of these films is formed through known methods. For example, the Cu film 251 is formed through electroplating etc., and the cap layer 252, first silicon dioxide film 253, and second silicon dioxide film 255 are formed through a CVD process.

A photoresist pattern is formed in these superimposed films through a normal exposure process and include a hole 256 and a wire groove 257 formed by anisotropic etching. A Ta film 258 serving as the barrier film is formed in the hole 256 and the wire groove 257 and on the second silicon dioxide film 255 through sputtering, as shown in FIG. 18(b).

Next, as shown in FIG. 18(c), a second Cu film 259 is formed on the entire surface of the Ta film 258 so as to fill the hole 256 and the wire groove 257. Thereafter, as shown in FIG. 18(d), the Cu film 259 formed on the Ta film 258 at a flat portion 551 of the second silicon dioxide film 255 is polished and removed through a chemical mechanical polishing (CMP) process. Then, as shown in FIG. 18(e), the Ta layer 58 exposed on the flat portion 551 is polished and removed through the CMP process. The Cu film 259 is thus filled only in the hole 256 and the wire groove 257.

The multilayer wiring structure is obtained by repeating the formation of copper wires and the formation of vias as described above.

However, if the Ta film 258 is used as the barrier film, the Ta film 258 remains on the second silicon dioxide film 255 when removing the Ta film 258 from the flat portion 551 (see FIG. 18(e)) and causes a characteristic defect of the semiconductor device.

[Patent Document 1] Japanese Laid-Open Patent Publication No. 2002-43315

[Patent Document 2] Japanese Laid-Open Patent Publication No. 2003-17496

[Patent Document 3] Japanese Laid-Open Patent Publication No. 2004-6856 (Claims etc.)

SUMMARY OF THE INVENTION

One aspect of the present invention provides a manufacturing apparatus and a manufacturing method for semiconductor devices that improve the reliability and productivity of a metal cap layer.

Another aspect of the present invention provides a method for forming a barrier film other than a Ta film and a barrier film obtained through the method.

A further aspect of the present invention provides a multilayer wiring structure and a method for fabricating a multilayer wiring structure that includes a barrier film obtained through the method for forming a barrier film according to the present invention.

A first aspect of the present invention is a method for manufacturing a semiconductor device. The method includes an insulation layer step of superimposing an insulation layer on a semiconductor substrate including an element region, a recess step of forming a recess in the insulation layer, a metal layer step of embedding a metal layer in the recess, a planarization step of planarizing a surface of the insulation layer and a surface of the metal layer to be substantially flush with each other, and a metal cap layer step of forming a metal cap layer containing at least zirconium element and nitrogen element on the surface of the insulation layer and the surface of the metal layer after the planarization step.

A second aspect of the present invention is a method for manufacturing a semiconductor device. The method includes an insulation layer step of superimposing an insulation layer on a semiconductor substrate including an element region, a recess step of forming a recess in the insulation layer, a metal layer step of embedding a metal layer in the recess, a planarization step of planarizing a surface of the insulation layer and a surface of the metal layer to be substantially flush with each other, and a metal cap layer step of forming a metal cap layer containing at least zirconium element and nitrogen element on the surface of the insulation layer and the surface of the metal layer using gas containing zirconium and gas containing nitrogen after the planarization step.

A third aspect of the present invention is a method for manufacturing a semiconductor device. The method includes an insulation layer step of superimposing an insulation layer on a semiconductor substrate including an element region, a recess step of forming a recess in the insulation layer, a metal layer step of embedding a metal layer in the recess, a planarization step of planarizing a surface of the insulation layer and a surface of the metal layer to be substantially flush with each other, and a metal cap layer step of forming a metal cap layer containing at least zirconium element and nitrogen element on the surface of the insulation layer and the surface of the metal layer using $Zr(BH_4)_4$ gas and excited nitrogen gas after the planarization step.

A fourth aspect of the present invention is an apparatus for manufacturing a semiconductor device. The apparatus includes a chamber body including a reaction chamber. A stage holds a semiconductor substrate and is arranged in the reaction chamber. A first supply means supplies gas containing zirconium to the reaction chamber. A second supply means supplies gas containing nitrogen to the reaction chamber. The gas containing zirconium and the gas containing nitrogen are used to form a metal cap layer containing at least zirconium element and nitrogen element on the surface of the semiconductor substrate.

A fifth aspect of the present invention is an apparatus for manufacturing a semiconductor device. The apparatus includes a chamber body including a reaction chamber. A stage holds a semiconductor substrate and is arranged in the reaction chamber. A first supply means supplies the reaction chamber with $Zr(BH_4)_4$ gas. A second supply means supplies the reaction chamber with excited nitrogen gas. A control means drives the first and second control means. The $Zr(BH_4)_4$ gas and the excited nitrogen gas are used to form a metal cap layer containing at least zirconium element and nitrogen element on a surface of the semiconductor substrate.

A sixth aspect of the present invention is a method for forming a barrier film. The method includes forming a ZrBn film as the barrier film on a surface of a film formation subject including an insulation film, in which the insulation film includes a hole and a wire groove. The ZrBN film is formed on an inner surface of each of the hole and the wire groove and on the insulation film.

A seventh aspect of the present invention is a method for forming a barrier film. The method includes forming a ZrBn film as the barrier film through a CVD process using $Zr(BH_4)_4$ gas and excited nitrogen gas on a surface of a film formation subject including an insulation film, in which the insulation film includes a hole and a wire groove. The ZrBN film is formed on an inner surface of each of the hole and the wire groove and on the insulation film.

An eighth aspect of the present invention is a method for forming a barrier film. The method includes forming a ZrBn film as the barrier film on a surface of a film formation subject including an insulation film through an atomic layer deposition process that repeats an adsorption process using only $Zr(BH_4)_4$ gas and a reaction process using only excited nitrogen gas, in which the insulation film includes a hole and a wire groove. The ZrBN film is formed on an inner surface of each of the hole and the wire groove and on the insulation film.

A ninth aspect of the present invention is a method for fabricating a multilayer wiring structure. The method includes superimposing at least a wiring film, a cap layer, a first insulation film, and a second insulation film in this order on a substrate; forming a hole, which connects to the wiring film, and a wire groove from a surface of the second insulation film to the hole; forming a ZrBN film as a barrier film on an inner surface of each of the hole and the wire groove and on the second insulation film; and embedding a copper wire in the hole and the wire groove that include the ZrBN film.

A tenth aspect of the present invention is a method for fabricating a multilayer wiring structure. The method includes superimposing at least a wiring film, a cap layer, a first insulation film, and a second insulation film in this order on a substrate; forming a hole, which connects to the wiring film, and a wire groove from a surface of the second insulation film to the hole; forming a ZrBN film as a barrier film on an inner surface of each of the hole and the wire groove and on the second insulation film through a CVD process using $Zr(BH_4)_4$ gas and excited nitrogen gas; and embedding a copper wire in the hole and the wire groove that include the ZrBN film.

An eleventh aspect of the present invention is a method for fabricating a multilayer wiring structure. The method includes superimposing at least a wiring film, a cap layer, a first insulation film, and a second insulation film in this order on a substrate; forming a hole, which connects to the wiring film, and a wire groove from a surface of the second insulation film to the hole; forming a ZrBN film as a barrier film on an inner surface of each of the hole and the wire groove and on the second insulation film through an atomic layer deposition process that repeats an adsorption process using only $Zr(BH_4)_4$ gas and a reaction process using only excited nitrogen gas; and embedding a copper wire in the hole and the wire groove that include the ZrBN film.

A twelfth aspect of the present invention is a multilayer wiring structure. The multilayer wiring structure includes a substrate, a wiring film on the substrate, a cap layer on the wiring film, a first insulation film on the cap layer, and a second insulation film on the first insulation film. The cap layer and the first insulation film include a hole connected to the wiring film, and the second insulation film includes a wire groove from a surface of the second insulation film to the hole. A ZrBN film is formed as a barrier film on an inner surface of each of the hole and the wire groove and on the second insulation film. A copper wire is embedded in the hole and the wire groove that include the ZrBN film.

DETAILED DESCRIPTION OF THE PREFERRED EMBODIMENT

When checking ZrN as one of the metal barrier materials, the inventors of the present invention have found that $ZrB_xN_y$ film containing boron (B) has satisfactory adhesiveness and high barrier properties with respect to the metal wiring in addition to having high underlayer dependency with regard to conductivity in the same manner as the ZrN film.

In other words, the inventors of the present invention have found that a $ZrB_xN_y$ film (x including zero) has satisfactory adhesiveness, high conductivity, and high barrier properties when used as a metal cap layer in addition to having high conductivity on a metal film (e.g., on Cu wiring) and high insulativeness on the insulation film (e.g., on the Low-k film or the hard mask). The inventors have also found that the generation of particles may be avoided and that a stable reaction system may be formed by using $Zr(BH_4)_4$ and excited nitrogen gas ($N_2$ gas) as raw material gas for the $ZrB_xN_y$ film.
(First Embodiment)

Figure 1:
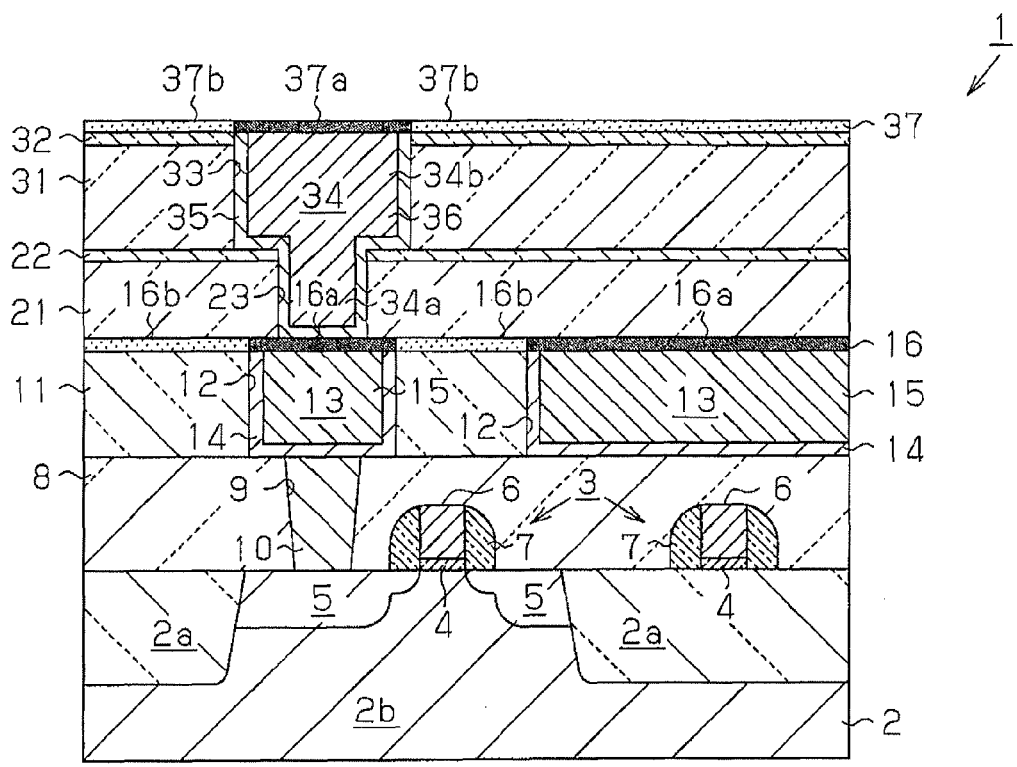
FIG. 1 is a cross-sectional view showing the main parts of a semiconductor device according to the present invention.

A first embodiment of a manufacturing method and a manufacturing apparatus of a semiconductor device 1 according to the present invention will now be discussed with reference to the drawings. First, the semiconductor device 1 manufactured through the manufacturing method of the first embodiment will be discussed. The semiconductor device 1 is a memory including various types of RAMs or various types of ROMs, a logic including an MPU or a versatile logic, or the like. FIG. 1 is a cross-sectional view showing the main parts of the semiconductor device 1.

(Semiconductor Device 1)

In FIG. 1, the semiconductor device 1 includes a silicon substrate 2, which forms semiconductor substrate. The silicon substrate 2 has a surface (i.e., upper surface shown in FIG. 1) including an isolation region 2a and an element region 2b, which is surrounded by the isolation region 2a. An insulation film such as a silicon dioxide film that forms an STI (Shallow Trench Isolation) structure is embedded in the isolation region 2a. A MOS transistor 3 is formed on the element region 2b. The MOS transistor 3 is configured by a gate insulation film 4 formed on the element region 2b, a source-drain region 5 formed on opposite sides of the gate insulation film 4, a gate electrode 6 superimposed on the gate insulation film 4, and a side wall 7 that covers an outer surface of the gate electrode 6.

A first interlayer insulation film 8 that covers the MOS transistor 3 is superimposed on the surface of the silicon substrate 2. The first interlayer insulation film 8 may be formed from silicon dioxide film (PSG) added with phosphorous or silicon dioxide film (BPSG) added with phosphorous and boron. The first interlayer insulation film 8 includes a recess (hereinafter simply referred to as contact hole 9) that extends therethrough and reaches the source-drain region 5. A contact plug 10 is formed in the contact hole 9. The contact plug 10 may be configured by a superimposed structure including a contact layer/barrier layer/plug layer (e.g., titanium silicide/titanium nitride/tungsten).

A second interlayer insulation film 11 is superimposed on the surface of the first interlayer insulation film 8. Silicon dioxide film, silicon dioxide film added with phosphorous, and the like may be used as the second interlayer insulation film 11. The second interlayer insulation film 11 includes a recess (hereinafter simply referred to as first trench 12) that extends therethrough and reaches the contact hole 9 (or contact plug 10). A first wire 13 is formed in the first trench 12. The first wire 13 may be configured by a superimposed structure including a first barrier layer 14 first wire layer 15 (e.g., tantalum nitride (or titanium nitride)/copper).

A first metal cap layer 16 commonly used by the second interlayer insulation film 11 and the first wire 13 (i.e., first barrier layer 14 and first wire layer 15) is superimposed on the surface of the second interlayer insulation film 11. The first metal cap layer 16 is a layer of which the main component is zirconium nitride (ZrN) or zirconium boron nitride (ZrB$_x$N$_y$) having a high oxidation resistance, and has a conductivity corresponding to the conductivity of the underlayer. The first metal cap layer 16 has a specific resistance of several to several tens of [μΩ·cm] in a region (region indicated with dark dots in FIG. 1) corresponding to the surface of the first wire 13. The first metal cap layer 16 has an infinitely large specific resistance in a region (region indicated with light dots in FIG. 1) corresponding to the surface of the second interlayer insulation film 11.

The region of the first metal cap layer 16 corresponding to the surface of the first wire 13 is referred to as a first conductive region 16a. The region of the first metal cap layer 16 corresponding to the surface of the second interlayer insulation film 11 is referred to as a first insulative region 16b.

The first metal cap layer 16 has a high barrier property with respect to moisture. The first metal cap layer 16 surrounds the first wire layer 15 with the first conductive region 16a and the first barrier layer 14 to inhibit oxidation of the first wire layer 15. The first metal cap layer 16 covers the surface of the second interlayer insulation film 11 and inhibits moisture absorption of the second interlayer insulation film 11. The first metal cap layer 16 prevents metal diffusion of the first wire 13 and migration of the first wire 13 by the high adhesiveness and the high barrier property with respect to the first wire 13.

The first metal cap layer 16 has high conductivity at the first conductive region 16a and high insulativeness at the first insulative region 16b. Thus, the first metal cap layer 16 is conductive only at the first conductive region 16a corresponding to the first wire 13 and is insulative at the first insulative region 16b corresponding to the second interlayer insulation film 11 irrespective of coarseness/denseness, surface area, shape, and the like of the first wire 13.

The first metal cap layer 16 thereby ensures prevention of short circuiting between the adjacent first wires 13. The first metal cap layer 16 is formed on the entire surface of the silicon substrate 2 (i.e., surface of second interlayer insulation film 11 and surface of first wire 13) and thereby suppresses film thickness variations in each first wire 13 and prevents covering defects of the first wire 13 caused by such variations in film thickness.

A third interlayer insulation film 21 and a trench etching stopper 22 are superimposed on the surface of the first metal cap layer 16. The third interlayer insulation film 21 may be configured by a low permittivity film (hereinafter simply referred to as Low-k film) of organic silica glass, porous silica glass, etc. The trench etching stopper 22 is a film having a high etching selection ratio with respect to the third interlayer insulation film 21 and may be configured by a silicon nitride film, silicon carbide film, and the like. The third interlayer insulation film 21 and the trench etching stopper 22 include a common recess (hereinafter simply referred to as via hole 23) extending therethrough and reaching the first conductive region 16a of the first metal cap layer 16.

A fourth interlayer insulation film 31 and a hard mask 32 are superimposed on the surface of the trench etching stopper 22. The fourth interlayer insulation film 31 may be configured by various types of Low-k film etc. in the same manner as the third interlayer insulation film 21. The hard mask 32 is a film having high etching selection ratio with respect to the fourth interlayer insulation film 31 and may be configured by a silicon nitride film, silicon carbide film, and the like. The fourth interlayer insulation film 31 and the hard mask 32 include a common recess (hereinafter simply referred to as second trench 33) extending therethrough and connecting to the via hole 23.

A second wire 34 is formed in the via hole 23 and the second trench 33. The second wire 34 includes a via contact 34a, which corresponds to the via hole 23, and a second wire portion 34b, which corresponds to the second trench 33. The second wire 34 may be configured by a superimposed structure including a second barrier layer 35 second wire layer 36 (e.g., tantalum nitride (or titanium nitride)/copper).

The second wire 34 is connected to the first wire 13 by the first conductive region 16a of the first metal cap layer 16. The first metal cap layer 16 enables electrical connection of the first wire 13 and the second wire 34 while preventing oxidation of the first conductive region 16a with its high oxidation resistance.

A second metal cap layer 37 commonly used by the hard mask 32 and the second wire 34 (i.e., second barrier layer 35 and second wire layer 36) is superimposed on the surface of the hard mask 32. In the same manner as the first metal cap layer 16, the second metal cap 37 is a layer having ZrB$_x$N$_y$ (x including zero) as the main component and has a conductivity corresponding to the conductivity of the underlayer. The second metal cap layer 16 has a specific resistance of several to several tens of [μΩ·cm] in a region (region indicated with dark dots in FIG. 1) corresponding to the surface of the second wire 34. The second metal cap layer 37 has an infinitely large specific resistance in a region (region indicated with light dots in FIG. 1) corresponding to the surface of the hard mask 32.

The region of the second metal cap layer 37 corresponding to the surface of the second wire 34 is referred to as a second conductive region 37a. The region of the second metal cap layer 17 corresponding to the surface of the hard mask 32 is referred to as a second insulative region 37b.

The second metal cap layer 37 has a high barrier property with respect to moisture. The second metal cap layer 37 surrounds the second wire layer 36 with the second conductive region 37a and the second barrier layer 35 to inhibit the oxidation of the second wire layer 36. The second metal cap layer 37 covers the surface of the hard mask 32, and inhibits moisture absorption of the fourth interlayer insulation film 31 to stabilize the permittivity of the low-k film. The second metal cap layer 37 prevents metal diffusion from the second wire 34 and migration of the second wire 34 by the high adhesiveness and the high barrier property with respect to the second wire 34.

The second metal cap layer 37 has high conductivity at the second conductive region 37a and high insulativeness at the second insulative region 37b. Thus, the second metal cap layer 37 has conductivity only at the second conductive region 37a in correspondence with the second wire 34 and has insulativeness at the second insulative region 37b in correspondence with the hard mask 32 irrespective of coarseness/denseness, surface area, shape, and the like of the second wire 34.

The second metal cap layer 37 thereby ensures prevention of short circuiting between the adjacent second wires 34. The second metal cap layer 37 is formed on the entire surface of the silicon substrate 2 (i.e., surface of hard mask 32 and surface of second wire 34) and thereby suppresses film thickness variations for each second wire 34 and prevents covering defects of the second wire 34 caused by such variations in film thickness.

(Manufacturing Apparatus for Semiconductor Devices)

A film formation device 40 serving as the manufacturing apparatus for the semiconductor device 1 will now be discussed.

Figure 2:
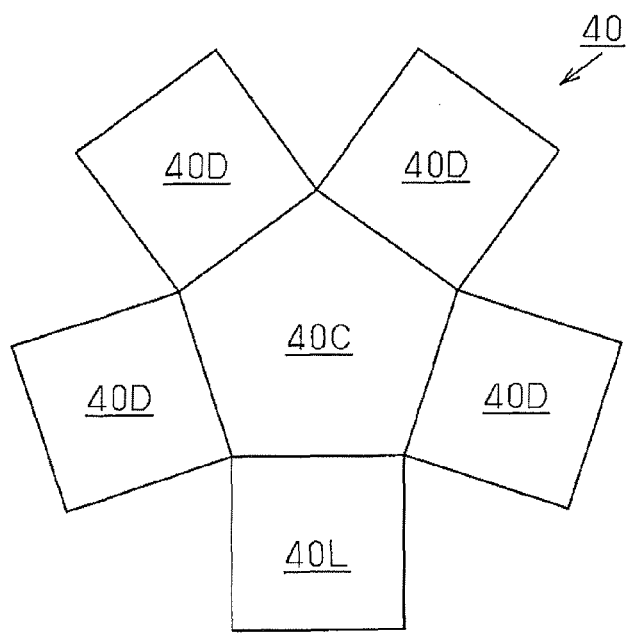
FIG. 2 is a plan view showing a film formation device for manufacturing the semiconductor device of FIG. 1.

In FIG. 2, the film formation device 40 includes a load lock chamber 40L, a core chamber 40C connected to the load lock chamber 40L, and four film formation chambers 40D connected to the core chamber 40C. The load lock chamber 40L, the film formation chamber 40D, and the core chamber 40C disconnectably connected to the chambers 40L and 40D form a common vacuum system.

When accommodating a plurality of silicon substrates 2 in a depressurized space and starting a film formation process on the silicon substrates 2, the load lock chamber 40L load the silicon substrates 2 into the film formation device 40. When ending the film formation process on the silicon substrates 2, the load lock chamber 40L accommodates the silicon substrates 2 that have undergone the film formation process, opens the film formation device 40 to the atmosphere while, and transfers the silicon substrates 2 out of the film formation device 40.

When starting the film formation process on the silicon substrates 2, the core chamber 40C loads the silicon substrate 2 that are to undergo the film formation process from the load lock chamber 40L and transfers the silicon substrates 2 to each film formation chamber 40D. When ending the film formation process of the silicon substrate 2, the core chamber 40C loads the silicon substrates 2 that have undergone the film formation process from each film formation chamber 40D and transfers the silicon substrates to the load lock chamber 40L.

Each film formation chamber 40D is a chamber for formation of a $ZrB_xN_y$ film using the CVD process or the atomic layer deposition process (ALD). When executing the film formation process on a silicon substrate 2, each film formation chamber 40D receives the silicon substrate 2 from the core chamber 40C and forms the $ZrB_xN_y$ film, that is, the first and the second metal cap layers 16 and 37 on the surface of the silicon substrate 2.

Figure 3:
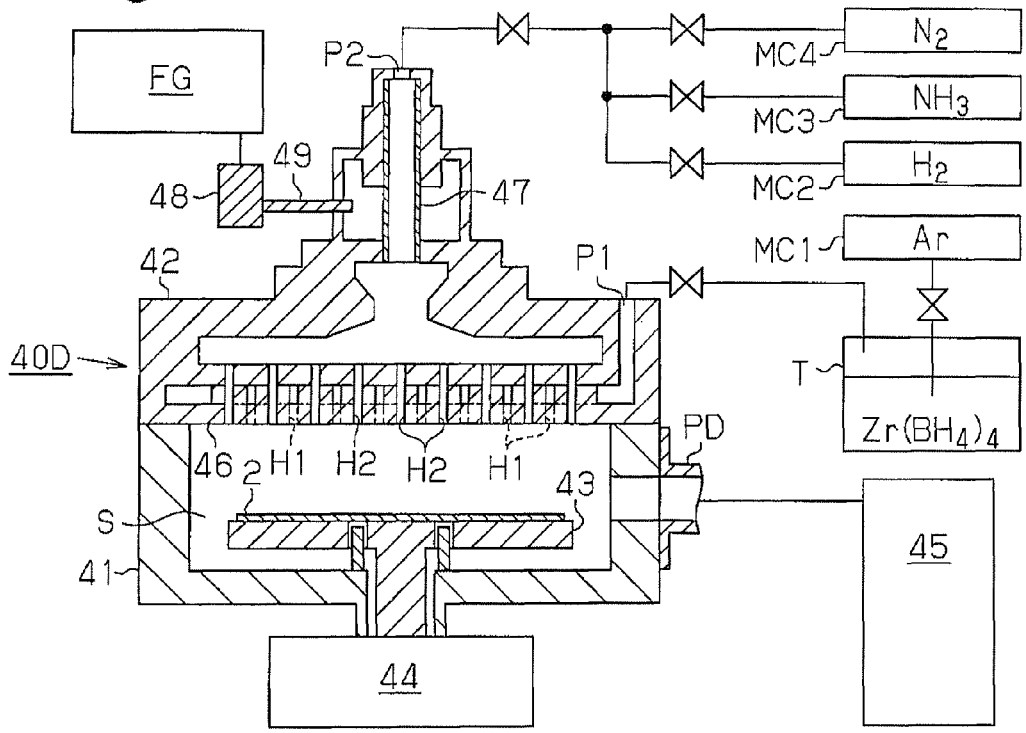
FIG. 3 is a schematic cross-sectional view showing a film formation chamber arranged in the film formation device of FIG. 2.

In FIG. 3, the film formation chamber 40D includes a chamber body 41, which has an open upper part, and a chamber lid 42, which is arranged on the upper part of the chamber body 41 to open and close the upper opening. The film formation chamber 40D includes an internal cavity (hereinafter simply referred to as reaction chamber S) surrounded by the chamber body 41 and the chamber lid 42.

A substrate stage 43 for holding the silicon substrate 2 is arranged in the chamber body 41. The substrate stage 43 includes a resistor heater. When holding the silicon substrate 2, the substrate stage 43 raises the temperature of the silicon substrate 2 to a predetermined temperature (e.g., 200 [° C.] to 240 [° C.]). A raising/lowering mechanism 44 is coupled at the lower side of the substrate stage 43. The raising/lowering mechanism 44 raises and lowers the substrate stage 43 in the vertical direction so as to enable transfer of the silicon substrate 2.

A discharge pump 45 is connected to one side of the chamber body 41 via a discharge port PD. The discharge pump 45, which may be any one of various types of pumps such as turbo molecular pump and dry pump, depressurizes the pressure of the reaction chamber S to a predetermined pressure (e.g., 1 [Pa] to 1000 [Pa]).

A shower head 46 for drawing gas into the reaction chamber S is arranged on the lower side of the chamber lid 42. The shower head 46 includes a plurality of first gas supply holes H1 and a plurality of second gas supply holes $H_2$, which are independent from the first gas supply holes H1. The shower head 46 draws $Zr(BH_4)_4$ gas from each first gas supply hole H1 towards the reaction chamber S. The shower head 46 draws nitrogen gas from each second gas supply hole $H_2$ towards the reaction chamber S.

A first gas port P1 is arranged in one side of the upper part of the chamber lid 42. The first gas port P1 is in communication with each first gas supply hole Hi of the shower head 46 through the interior of the chamber lid 42. The first gas port P1 is connected to a supply tank T outside the chamber lid 42 by a supply pipe and a supply valve. The supply tank T accommodates $Zr(BH_4)_4$ under a temperature maintained at 0° C. and is coupled to a mass flow controller MC1.

The mass flow controller MC1, which is connected to a supply system of a carrier gas (e.g., argon (Ar)), and supplies Ar at a predetermined flow rate into the supply tank T. The mass flow controller MC1 controls the supplied amount of Ar in a flow rate range of, for example, 10 [sccm] and 500 [sccm]. When the mass flow controller MC1 supplies the carrier gas, the supply tank T bubbles the accommodating $Zr(BH_4)_4$ and supplies the carrier gas containing $Zr(BH_4)_4$ (hereinafter simply referred to as $Zr(BH_4)_4$ gas) to the first gas port P1. The $Zr(BH_4)_4$ gas passes through the first gas port P1 and is drawn into the reaction chamber S from each first gas supply hole H1.

A second gas port P2 is arranged at an upper end of the chamber lid 42. The second gas port P2 is in communication with each second gas supply hole $H_2$ of the shower head 46 through the interior of the chamber lid 42. The second gas port P2 is connected to a mass flow controller MC2, a mass flow controller MC3, and a mass flow controller M4 by a supply pipe and a supply valve outside the chamber lid 42.

The mass flow controllers MC2, MC3, and MC4 are respectively coupled to supply systems of hydrogen ($H_2$) gas, ammonia ($NH_3$) gas, and nitrogen (N2) gas, and supply $H_2$, $NH_3$, N2 of a predetermined flow rate to the second gas port P2. The mass flow controllers MC2, MC3, and MC4 control the supplying amount of $H_2$, $NH_3$, and N2 in a flow rate range of 10 [sccm] to 500 [sccm]. When the mass flow controllers MC2, MC3, and MC4 respectively supply $H_2$, $NH_3$, N2, this causes $H_2$, $NH_3$, and N2 to pass through the second gas port P2 and into the reaction chamber S through each second gas supply hole $H_2$ thereby reaching the surface of the silicon substrate 2 on the substrate stage 43.

An irradiation tube 47 is arranged in a flow passage between the second gas port P2 and the second gas supply hole $H_2$ at the upper part of the chamber lid 42. The irradiation tube 47 is a cylindrical tube, which is heat resistant, formed by a silica tube or alumina tube, and guides the gas supplied to the second gas port P2 towards each second gas supply hole $H_2$.

At the outer side of the irradiation tube 47 and near the longitudinally middle part of the irradiation tube 47, a microwave source 48 is driven by a microwave power supply FG. Further, a waveguide 49 is connected to the microwave source 48 and extends towards the irradiation tube 47.

The microwave source 48 is a microwave oscillator (i.e., magnetron) that generates microwaves of, for example, 2.45 GHz and intermittently outputs microwaves in a predetermined output range (e.g., 0.1 to 3.0 [kW]) when powered by the microwave power supply FG. The waveguide 49 propagates the microwaves oscillated by the microwave source 48 through the interior of the waveguide 49 and sends the microwaves into the irradiation tube 47. When the microwave source 48 oscillates microwaves, the waveguide 49 irradiates the microwaves on the gas passing through the irradiation tube 47 to excite and activate (i.e., generate a plasmatic state) the gas.

The microwave generated by the microwave source 48 excites the gas drawn from the second gas port P2 into the irradiation tube 47, and the excited gas is drawn from each second gas supply hole $H_2$ into the reaction chamber S. The $Zr(BH_4)_4$ in the reaction chamber S reacts with the excited $N_2$ gas and forms a $ZrB_xN_y$ film on the surface of the silicon substrate 2.

An electrical configuration of the film formation device 40 will now be discussed.

Figure 4:
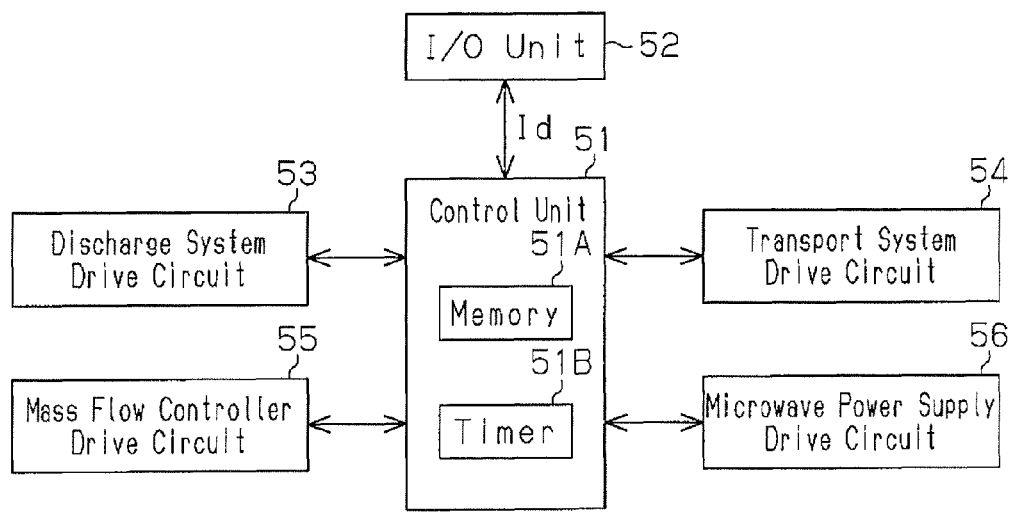
FIG. 4 is a block circuit diagram showing the electrical configuration of the film formation device of FIG. 2.

In FIG. 4, a control unit 51 causes the film formation device 40 to execute various types of processing operations such as a transfer processing operation for the silicon substrates 2 and a film formation processing operation for the silicon substrate 2. The control unit 51 includes a CPU for executing various calculation processes, a memory 51A for storing various types of data and various types of control programs, and a timer 51B for timing the processing time for each processing step. For instance, the control unit 51 reads the film formation processing program stored in the memory 51A and causes the film formation device 40 to execute the film formation processing operation in accordance with the processing time timed by the timer 51B and the read film formation processing program.

The control unit 51 is connected to an I/O unit 52. The I/O unit 52 includes various types of operation switches, such as start switch and stop switch, and various types of displays, such as liquid crystal display. The I/O unit 52 provides the control unit 51 with data used in each processing operation and outputs (e.g., displays) the data related to the processing status of the film formation device 40. The I/O unit 52 provides the control unit 51 with data (hereinafter simply referred to as film formation condition data Id) related to various types of parameters (processing time, gas flow rate, output value of microwave power supply FG, etc.) for film formation. The control unit 51 receives the film formation condition data Id provided from the I/O unit 52 and generates various drive control signals corresponding to the film formation condition data Id. That is, the control unit 51 causes the film formation device 40 to execute the film formation processing operation under film formation conditions corresponding to the film formation condition data Id.

The control unit 51 is connected to a discharge system drive circuit 53 for driving and controlling the discharge system. The control unit 51 provides a first drive control signal corresponding to the discharge system drive circuit 53 to the discharge system drive circuit 53. In response to the first drive control signal, the discharge system drive circuit 53 drives the discharge system (e.g., discharge pump 45) to depressurize the interior of the chamber (e.g., reaction chamber S) to a predetermined pressure.

The control unit 51 is connected to a transfer system drive circuit 54. The control unit 51 provides a second drive control signal corresponding to the transfer system drive circuit 54 to the transfer system drive circuit 54. In response to the second drive control signal, the transfer system drive circuit 54 drives the transfer system (e.g., raising/lowering mechanism 44) for transferring the silicon substrate 2. The transfer system drive circuit 54 also drives a heater of the substrate stage 43 for raising the temperature of the silicon substrate 2 in response to the second drive control signal.

The control unit 51 is connected to a mass flow controller drive circuit 55. The control unit 51 provides a third drive control signal corresponding to the mass flow controller drive circuit 55 to the mass flow controller drive circuit 55. In response to the third drive control signal, the mass flow controller drive circuit 55 drives each mass flow controller MC1 to MC4 for supplying each gas.

The control unit 51 is connected to a microwave power supply drive circuit 56. The control unit 51 provides a fourth drive control signal corresponding to the microwave power supply drive circuit 56 to the microwave power supply drive circuit 56. In response to the fourth drive control signal, the microwave power supply drive circuit 56 drives the microwave power supply FG for oscillating the microwave.

(Manufacturing Method for Semiconductor Devices 1)

The manufacturing method for the semiconductor devices 1 using the film formation device 40 will now be discussed.

First, the isolation region 2a and the element region 2b are defined on the surface of the silicon substrate 2, as shown in FIG. 1. The silicon dioxide film is embedded in the isolation region 2a using a known STI process. The gate insulation film 4, the source-drain region 5, the gate electrode 6, and the side wall 7 are formed using a known MOS process to form the MOS transistor 3 at the element region 2b.

After the MOS transistor 3 is formed, the first interlayer insulation film 8 is superimposed on the surface of the silicon substrate 2 and the contact plug 10 is formed. For example, the first interlayer insulation film 8 is formed by superimposing the silicon dioxide film covering the MOS transistor 3 on the surface of the silicon substrate 2 through a CVD process, and the contact hole 9 is formed in the first interlayer insulation film 8 through a photolithography process and an etching process. Titanium silicide/titanium nitride/tungsten are filled in the contact hole 9 to form the contact plug 10 through a sputtering process or a CVD process. The surface of the contact plug 10 is made planar through a CMP (Chemical Mechanical Polishing) process or an etch-back process.

After the contact plug 10 is formed, the second interlayer insulation film 11 is superimposed on the surface of the first interlayer insulation film 8, and the first trench 12 is formed in the second interlayer insulation film 11. In other words, an insulation layer step is executed, and a recess step is subsequently executed. For example, the silicon dioxide film is superimposed on the surface of the first interlayer insulation film 8 to form the second interlayer insulation film 11 through a CVD process in the insulation layer step, and the first trench 12 is formed using the photolithography technique and the etching technique in the recess step.

After the first trench 12 is formed, the first wire 13 is superimposed on the surface of the second interlayer insulation film 11 including the inside of the first trench 12. Then, the surface of the second interlayer insulation film 11 and the surface of the first wire 13 are made planar. In other words, a metal layer step is executed, and a planarization step is subsequently executed. For example, in the metal layer step, titanium nitride is superimposed on the entire silicon substrate 2 including the inner side surface of the first trench 12 to form the first barrier layer 14 through a sputtering process. A copper plated seed layer is formed on the surface of the first barrier layer 14 through an electroless plating process or a CVD process. Then, copper is deposited on the entire silicon substrate 2 including the inner side of the first trench 12 to form the first wire layer 15 through an electrolytic plating process. In the planarization step, the first barrier layer 14 and the first wire layer 15 are polished using the CMP process so that the surfaces of the first barrier layer 14 and the first wire layer 15 are substantially flush with the surface of the second interlayer insulation film 11 when the first wire 13 is formed.

After the first wire 13 is formed, the silicon substrate 2 of which surface includes the second interlayer insulation film 11 and the first wire 13 is set in the load lock chamber 40L of the film formation device 40. Then, a metal cap layer step is executed.

In other words, the control unit 51 of the film formation device 40 receives the film formation condition data Id from the I/O unit 52, drives the discharge pump 45 through the discharge system drive circuit 53, and depressurizes the reaction chamber S for accommodating the silicon substrate 2 to a predetermined attainment pressure (e.g., 1 [Pa]). After depressurizing the reaction chamber S, the control unit 51 drives the transfer system through the transfer system drive circuit 54 and transfers the silicon substrate 2 of the load lock chamber 40L to the film formation chamber 40D.

Figure 5:
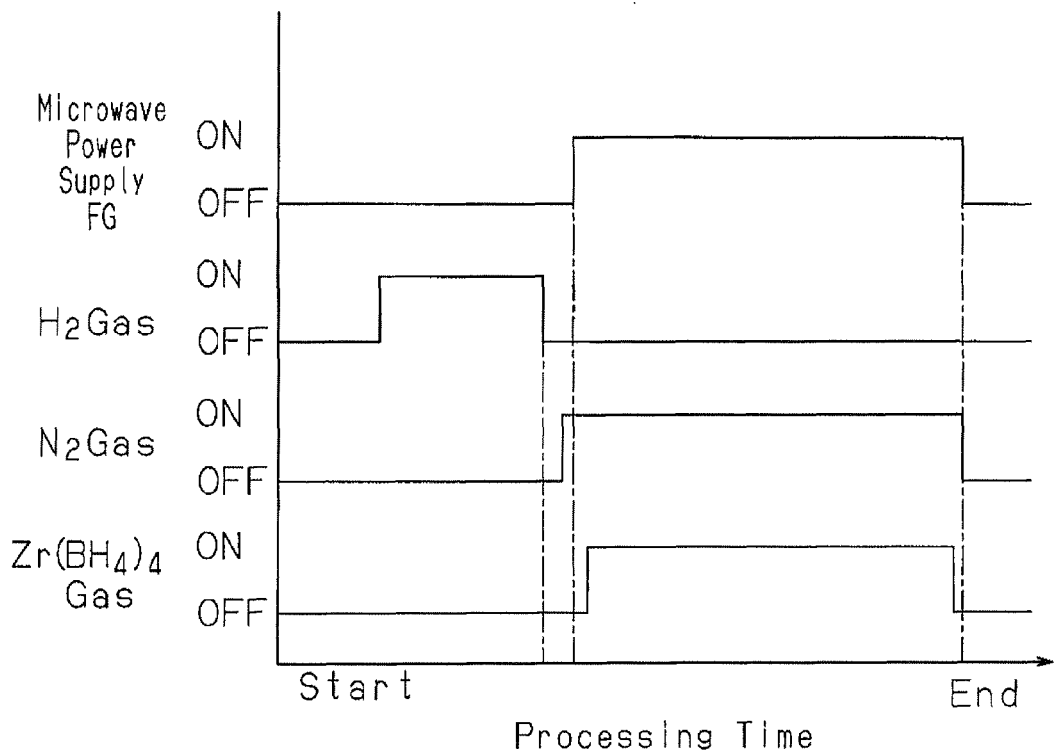
FIG. 5 is a timing chart showing the manufacturing process in a first embodiment.

The control unit 51 drives the raising/lowering mechanism 44 with the transfer system drive circuit 54 to arrange the silicon substrate 2 on the substrate stage 43. The control unit 51 then starts the timing operation of the processing time using the timer 51B and raises the temperature of the silicon substrate 2 to a predetermined temperature (e.g., 240 [° C.]). In this case, the control unit 51 drives the mass flow controller MC2 with the mass flow controller drive circuit 55 to supply $H_2$ gas of a predetermined flow rate to the reaction chamber S, as shown in FIG. 5. The control unit 51 also drives the discharge system with the discharge system drive circuit 53 to maintain the pressure of the reaction chamber S at a predetermined pressure value. This enhances the temperature rise of the silicon substrate 2. Further, as long as the temperature of the silicon substrate 2 is higher than or equal to 250 [° C.], the surface of the copper film (first wire 13) is reduced. When using hydrogen ($H_2$) excited by the microwave, the reduction effect of the surface of the copper film is achieved as long as the temperature of the silicon substrate 2 is higher than or equal to 130 [° C.].

When the processing time timed by the timer 51B reaches a predetermined time, the control unit 51 drives the discharge system drive circuit 53, the mass flow controller drive circuit 55, and the microwave power supply drive circuit 56 to execute each processing step in correspondence with the film formation condition data Id.

In other words, the control unit 51 drives the mass flow controller MC2 with the mass flow controller drive circuit 55 to stop the supply of $H_2$ gas. The control unit 51 then drives the discharge system through the discharge system drive circuit 53 and sets the discharge capability of the discharge system in advance so that the pressure of the reaction chamber S under the film formation condition becomes a predetermined pressure value.

After setting the discharge system, the control unit 51 drives the mass flow controller MC4 with the mass flow controller drive circuit 55 to supply the $N_2$ gas of a predetermined flow rate to the reaction chamber S. The control unit 51 also drives the microwave power supply FG with the microwave power supply drive circuit 56 to supply the excited $N_2$ gas to the reaction chamber S.

After starting the supply of the excited $N_2$ gas, the control unit 51 drives the mass flow controller MC1 with the mass flow controller drive circuit 55 to supply $Zr(BH_4)_4$ of a predetermined flow rate to the reaction chamber S. The control unit 51 thereby starts the gas phase reaction of the $Zr(BH_4)_4$ and the excited $N_2$ gas to deposit the first metal cap layer 16 of which main component is the $ZrB_xN_y$ film on the entire surface of the silicon substrate 2.

The deposited $ZrB_xN_y$ film has conductivity only at the region on the first wire 13 and prevents short circuiting between adjacent wirings irrespective of coarseness/denseness, surface area, shape, and the like of the first wire 13. Since the $ZrB_xN_y$ film has high oxidation resistance and high barrier property, oxidation of the $ZrB_xN_y$ film itself, oxidation of the first wire 13, moisture absorption of the second interlayer insulation film 11, and the like in the manufacturing process are inhibited. Furthermore, since the $ZrB_xN_y$ film has high adhesiveness with the first wire 13, mechanical damages such as film stripping of the first metal cap layer 16 can be avoided. Moreover, the $ZrB_xN_y$ film is formed on the entire silicon substrate 2 in the film formation chamber 40D. Thus, compared to when forming the metal cap layer for each first wire 13, the $ZrB_xN_y$ film suppresses film thickness variations between the first wires 13 and avoids covering defects of the first wire 13 caused by such variations in film thickness.

A stable reaction system may be provided by using the $Zr(BH_4)_4$ and the excited nitrogen gas ($N_2$ gas) as the raw material gases of the $ZrB_xN_y$ film. Further, the generation of particles across each area of the reaction system such as the interior of the reaction chamber S, the supply piping, and the discharge piping may be suppressed. Furthermore, compared to a thermal decomposition reaction of $Zr(BH_4)_4$ under an $N_2$ gas atmosphere, the $ZrB_xN_y$ film may contain a amount of nitrogen element that is greater by an amount corresponding to the used excited $N_2$ gas. The lifespan of the excited $N_2$ gas may be extended and the generation of the Zr—N bonds may be enhanced by the amount of the used the nitrogen gas ($N_2$ gas) that does not contain hydrogen element. As a result, the underlayer selectivity of the resistivity of the $ZrB_xN_y$ film may be further improved.

When the processing time timed by the timer 51B reaches a predetermined time, the control unit 51 drives the mass flow controller MC1 through the mass flow controller drive circuit 55 to stop the supply of the $Zr(BH_4)_4$ gas. The control unit 51 then stops the oscillation of the microwaves with the microwave power supply drive circuit 56 and stops the supply of the $N_2$ gas with the mass flow controller drive circuit 55. The control unit 51 then drives the transfer system with the transfer system drive circuit 54, transfers the silicon substrate 2 including the first metal cap layer 16 to the load lock chamber 40L, and transfers the silicon substrates 2 out of the film formation device 40.

After the first metal cap layer 16 is formed, the third interlayer insulation film 21, the trench etching stopper 22, the fourth interlayer insulation film 31, and the hard mask 32 are superimposed in this order on the surface of the first metal cap layer 16. In other words, the insulation layer step is executed.

For example, in the insulation layer step, an organic silica glass is superimposed on the surface of the first metal cap layer 16 to form the third interlayer insulation film 21 using a CVD process or a spin coating process, and a silicon carbide film is superimposed on the surface of the third interlayer insulation film 21 to form the trench etching stopper 22 using a CVD process. Furthermore, an organic silica glass is superimposed on the surface of the trench etching stopper 22 to form the fourth interlayer insulation film 31 using a CVD process or a spin coating process, and a silicon carbide film is superimposed on the surface of the fourth interlayer insulation film 31 to form the hard mask 32 using a CVD process.

After the hard mask 32 is formed, the via hole 23 is formed in the third interlayer insulation film 21 and the trench etching stopper 22, and the second trench 33 is formed in the fourth interlayer insulation film 31 and the hard mask 32. In other words, the recess step is executed. In the recess step, the via hole 23 and the second trench 33 are formed using a via first process, which first forms the via hole 23.

After the via hole 23 and the second trench 33 are formed, the second wire 34 is superimposed on the surface of the fourth interlayer insulation film 31 including the interior of the via hole 23 and the interior of the second trench 33, and the surface of the fourth interlayer insulation film 31 and the surface of the second wire 34 are made planar. In other words, the metal layer step is executed, and the planarization step is subsequently executed. For example, in the metal layer step, nitrogen titanium is superimposed over the entire silicon substrate 2 including the inner side surfaces of the via hole 23 and the second trench 33 to form the second barrier layer 35 through a sputtering process. The copper plated seed layer is then formed on the surface of the second barrier layer 35 with an electroless plating process or a CVD process, and then copper is deposited on the entire silicon substrate 2 including the inner sides of the via hole 23 and the second trench 33 to form the second wire layer 36 using the electrolytic plating process. In the planarization step, the second barrier layer 35 and the second wire layer 36 are polished using the CMP process so that the surfaces of the second barrier layer 35 and the second wire 36 are substantially flush with the surface of the hard mask 32 to form the second wire 34.

After the second wire 34 is formed, the silicon substrate 2 is transferred to the film formation device 40, and the second metal cap layer 37 is formed on the surfaces of the hard mask 32 and the second wire 34. In other words, a common $ZrB_xN_y$ film is superimposed on the entire surface of the silicon substrate 2 (surface of hard mask 32 and surface of second wire 34) to form the second metal cap layer 37 (execute metal cap layer step) in the same manner as the first metal cap layer 16.

In the same manner as the first metal cap layer 16, the second metal cap layer 37 has high oxidation resistance and high barrier property, and thus oxidation of the $ZrB_xN_y$ film itself, oxidation of the second wire 34, moisture absorption of the fourth interlayer insulation film 31, and the like in the manufacturing process are inhibited. Furthermore, since the $ZrB_xN_y$ film has high adhesiveness with the second wire 34, mechanical damages such as film stripping of the second metal cap layer 37 may be avoided. Moreover, the $ZrB_xN_y$ film is formed on the entire silicon substrate 2 by the film formation chamber 40D. Thus, compared to when forming the metal cap layer for each second wire 34, the $ZrB_xN_y$ film suppresses film thickness variations between the second wires 34 and avoids covering defects of the second wire 34 caused by variations in film thickness.

By using the $Zr(BH_4)_4$ and the excited nitrogen gas ($N_2$ gas) as the raw material gases of the second metal cap layer 37, a stable reaction system may be realized. Further, the generation of particles in each area of the reaction system such as the interior of the reaction chamber S, the supply piping, and the discharge piping, may be suppressed. Moreover, compared to the thermal decomposition reaction of the $Zr(BH_4)_4$ under the $N_2$ gas atmosphere, the $ZrB_xN_y$ film may contain nitrogen element that is greater by an amount corresponding to the used excited $N_2$ gas. The lifespan of the excited $N_2$ gas may be extended and the generation of the Zr—N bonds may be enhanced by the amount of used nitrogen gas ($N_2$ gas) that does not contain hydrogen element. As a result, the underlayer selectivity of the resistivity of the $ZrB_xN_y$ film may be further ensured.

EXAMPLES

The effects of the present invention will now be described using examples. Table 1 to table 4 show the conductivity of the $ZrB_xN_y$ film formed using the film formation device 40 under various conditions. FIGS. 6 to 9 show the element concentration in the examples and the comparative examples of tables 1 to 4. The film thickness data of the example is a value measured with a scanning electron microscope (SEM) by opening the vicinity of the center of the silicon substrate.

In table 1, the film formation was executed under conditions in which the $Zr(BH_4)_4$ gas was 100 [sccm], the $N_2$ gas was 100 [sccm], the film formation time was 2 [min], the film formation temperature was 240 [°C.], the pressure for film formation was 700 [Pa], and the microwave output was 500 [W] using the silicon substrate having a surface with a copper film to obtain the $ZrB_xN_y$ film of the first example. The film formation was executed under the same conditions as the first example using the silicon substrate having a surface with the silicon dioxide film to obtain the $ZrB_xN_y$ film of the second example. In this case, the number of particles in the film and on the film of the $ZrB_xN_y$ film was measured and the increased amount of particles was only a few particles. The inner wall of the reaction chamber S, the interior of the supply piping, and the interior of the discharge piping were visually checked to confirm that a powder-like by-product was not generated.

In table 1, the $ZrB_xN_y$ film of the first comparative example was obtained with the $N_2$ gas of the second example changed to the $NH_3$ gas and the other conditions being the same. Furthermore, the $ZrB_xN_y$ film of the second comparative example was obtained with the $N_2$ gas of the second example being changed to a gas mixture of $N_2$ gas and $H_2$ gas and the other conditions being the same. In this case, the number of particles in the film and on the film of the $ZrB_xN_y$ film was measured and the increased amount of the particles was only a few particles. The inner wall of the reaction chamber S, the interior of the supply piping and the interior of the discharge piping were visually checked to confirm that powder-like by-products was not generated.

Figure 6:
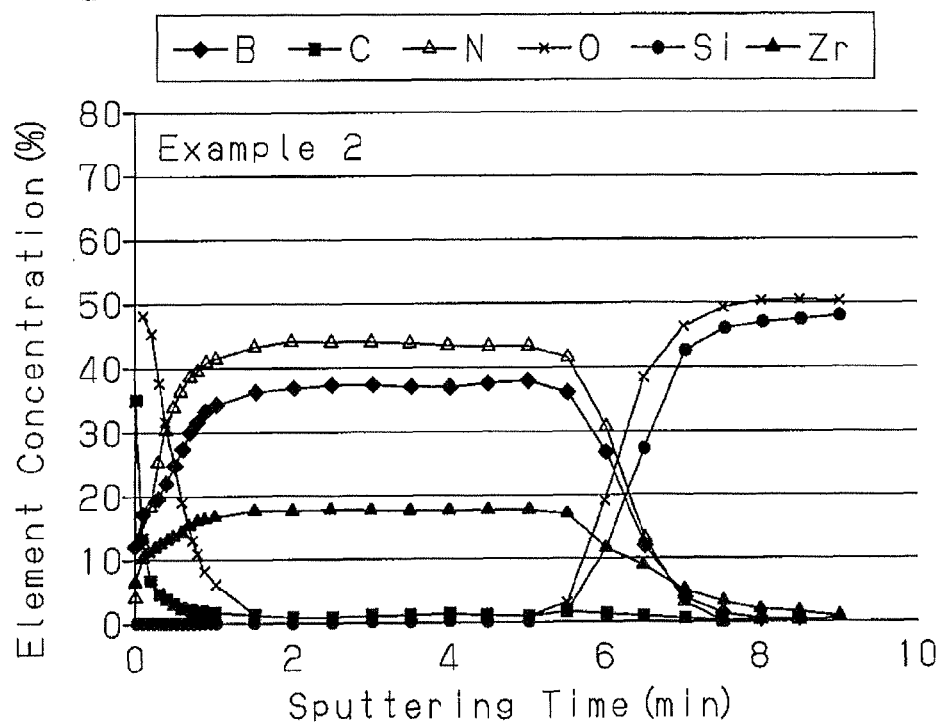
FIG. 6 is a diagram showing an element analysis result of a second example.
Figure 7:
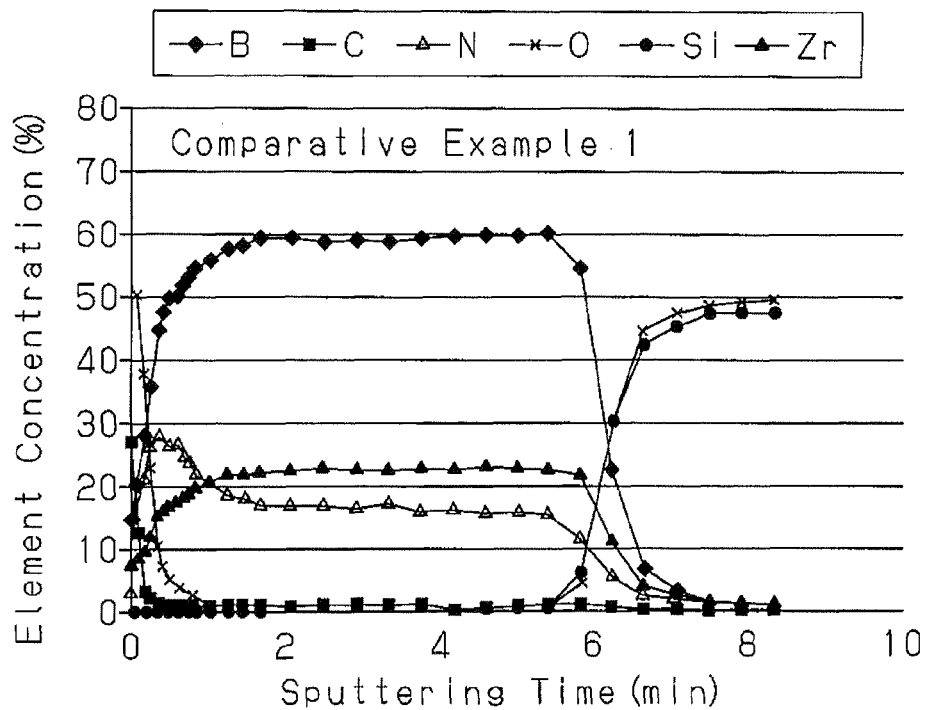
FIG. 7 is a diagram showing an element analysis result of a first comparative example.
Figure 8:
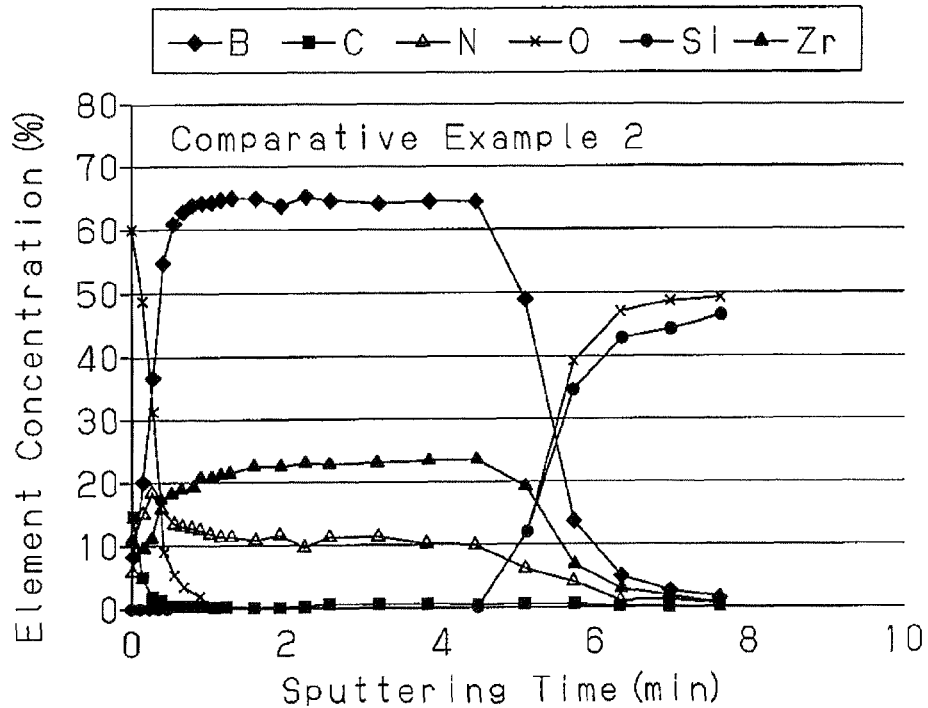
FIG. 8 is a diagram showing an element analysis result of a second comparative example.

The film thickness and the sheet resistance were measured with respect to the $ZrB_xN_y$ film in the first example, the second example, the first comparative example, and the second comparative example. The element concentration in the film was also measured using the Auger Electron Spectroscopy (AES) with respect to the $ZrB_xN_y$ film of the second example, the first comparative example, and the second comparative example. The results of the film thickness and the sheet resistance are shown in table 1, and the measurement results of the element concentration of the second example, the first comparative example, and the second comparative example are shown in FIGS. 6, 7, and 8, respectively. In FIGS. 6 to 9, the horizontal axis shows the sputtering time of the sample ($ZrB_xN_y$ film/silicon dioxide film), that is, the film thickness of the $ZrB_xN_y$ film, and the vertical axis shows the concentration of the subject element, that is, the element concentration of boron (B), carbon (C), nitrogen (N), oxygen (O), silicon (Si), and zirconium (Zr).

TABLE 1

|  | Ex. 1 | Ex. 2 | Com. Ex. 1 | Com. Ex. 2 |
|---|---|---|---|---|
| Flow rate of $Zr(BH_4)_4$ Gas [sccm] | 100 | 100 | 100 | 100 |
| Flow rate of $N_2$ Gas [sccm] | 100 | 100 | 0 | 50 |
| Flow rate of $NH_3$ Gas [sccm] | 0 | 0 | 100 | 0 |
| Flow rate of $H_2$ Gas [sccm] | 0 | 0 | 0 | 50 |
| Film Formation Time [min] | 2 | 2 | 2 | 2 |
| Film Formation Temperature [°] | 240 | 240 | 240 | 240 |
| Film Formation Pressure [Pa] | 700 | 700 | 700 | 700 |
| Microwave Output [W] | 500 | 500 | 500 | 500 |
| Underlayer Film | Cu | $SiO_2$ | $SiO_2$ | $SiO_2$ |
| Film Thickness [nm] | 29 | 15 | 50 | 33 |
| Sheet Resistance [Ω/square] | 6.05 | ∞ | $2.28 \times 10^2$ | $1.85 \times 10^2$ |
| Specific Resistance [μΩcm] | 18 | ∞ | 1140 | 611 |

In table 1, "∞" indicates that the sheet resistance of the corresponding $ZrB_xN_y$ film is a value exceeding the detection limit at all 49 measured points (greater than or equal to $5 \times 10^6$ [Ω/square]).

In table 1, it is apparent that the sheet resistance of the $ZrB_xN_y$ film of the first example is about 6 [Ω/square], and that the $ZrB_xN_y$ film superimposed on the copper film (conductive film) has high conductivity. It is apparent that the sheet resistance of the $ZrB_xN_y$ film of the second example is "∞", and that the $ZrB_xN_y$ film superimposed on the silicon dioxide film (insulation film) has high insulativeness. In other words, the $ZrB_xN_y$ film obtained by the film formation conditions of the first example and the second example has a large underlayer selectivity with respect to the resistivity.

The first comparative example and the second comparative example show a sheet resistance lower than the second example although a film is formed on the silicon dioxide film. In other words, the $ZrB_xN_y$ film superimposed on the silicon dioxide film (insulation film) does not fully exhibit insulativeness.

In FIG. 6, it is apparent that in the second example, the $ZrB_xN_y$ film contains nitrogen element (N) of higher concentration than the concentration of boron element (B), and nitrogen element exceeding 40% is contained in the bulk of the $ZrB_xN_y$ film. In FIGS. 7 and 8, it is apparent that in the first comparative example and the second comparative example, nitrogen element (N) of a concentration evidently lower than the concentration of boron element (B) is contained, and that the concentration is less than 20%.

From these results, the $NH_3$ gas of the first comparative example and the $H_2$ gas of the second comparative example, that is, hydrogen element in the process gas lowers the concentration of nitrogen element taken into the $ZrB_xN_y$ film and becomes the cause of inhibiting the insulativeness of the $ZrB_xN_y$ film. Thus, the gas phase reaction system of the nitrogen added gas that does not contain hydrogen element, that is, the excited $N_2$ gas and the $Zr(BH_4)_4$ enables the underlayer selectivity of the resistivity of the $ZrB_xN_y$ film to be more reliable. The gas phase reaction system of the $Zr(BH_4)_4$ and the excited nitrogen gas ($N_2$ gas) may provide a sufficiently stable system for the reaction system of the $ZrB_xN_y$ film since factors increasing particles were not found.

In table 2, the $ZrB_xN_y$ films of the third comparative example and the fourth comparative example were obtained with the film formation time of the second example being extended and the other conditions being the same. In table 3, the $ZrB_xN_y$ films of the fifth comparative example, the sixth comparative example, and the seventh comparative example were obtained with the film formation temperature of the second example being changed and the other conditions being the same. In table 4, the $ZrB_xN_y$ films of the eighth comparative example, the ninth comparative example, and the tenth comparative example were obtained with the film formation pressure and the microwave output of the second example being changed and the other conditions being the same. In this case, the number of particles in the film and on the film of each $ZrB_xN_y$ film was measured and the increased amount of particles was only a few particles. The inner wall of the reaction chamber S, the interior of the supply piping, and the interior of the discharge piping were visually checked to confirm that powder-like by-products were not generated.

Figure 9:
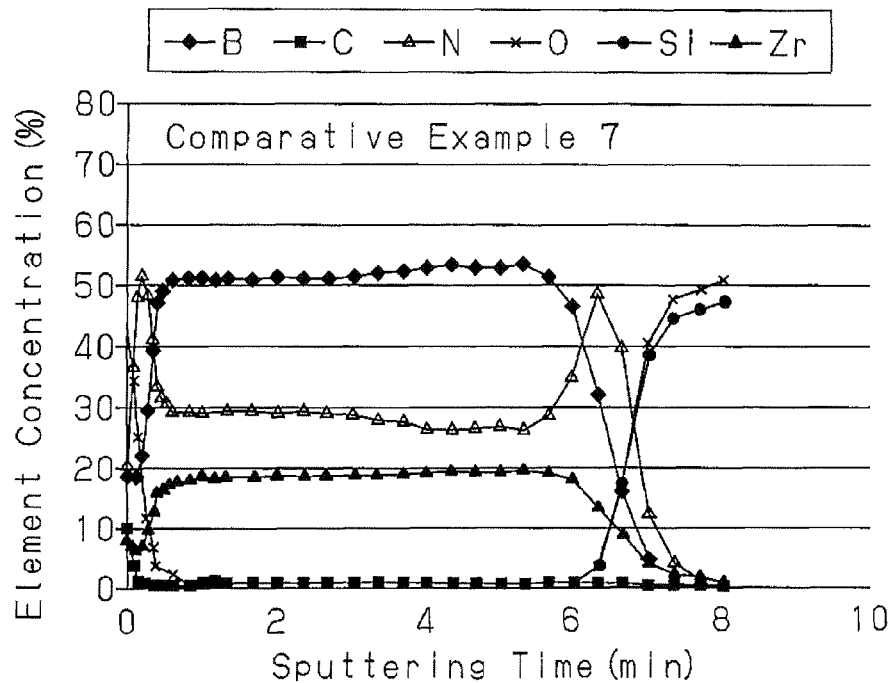
FIG. 9 is a diagram showing an element analysis result of a seventh comparative example.

The film thickness and the sheet resistance were measured with respect to the $ZrB_xN_y$ films of the third to tenth comparative examples. The element concentration in the film was also measured using the AES with respect to the $ZrB_xN_y$ film of the seventh comparative example. The results of the film thickness and the sheet resistance of the third to tenth comparative examples are shown in tables 2 to 4, and the measurement results of element concentrations in the seventh comparative example are shown in FIG. 9.

TABLE 2

|  | Ex. 2 | Com. Ex. 3 | Com. Ex. 4 |
|---|---|---|---|
| Flow rate of $Zr(BH_4)_4$ Gas [sccm] | 100 | 100 | 100 |
| Flow rate of $N_2$ Gas [sccm] | 100 | 100 | 100 |
| Flow rate of $NH_3$ Gas [sccm] | 0 | 0 | 0 |
| Flow rate of $H_2$ Gas [sccm] | 0 | 0 | 0 |
| Film Formation Time [min] | 2 | 4 | 8 |
| Film Formation Temperature [°] | 240 | 240 | 240 |
| Film Formation Pressure [Pa] | 700 | 700 | 700 |
| Microwave Output [W] | 500 | 500 | 500 |

TABLE 2-continued

|  | Ex. 2 | Com. Ex. 3 | Com. Ex. 4 |
|---|---|---|---|
| Underlayer Film | $SiO_2$ | $SiO_2$ | $SiO_2$ |
| Film Thickness [nm] | 15 | 30 | 45 |
| Sheet Resistance [Ω/square] | ∞ | ∞ | ∞ |
| Specific Resistance [μΩcm] | ∞ | ∞ | ∞ |

TABLE 3

|  | Ex. 2 | Com. Ex. 5 | Com. Ex. 6 | Com. Ex. 7 |
|---|---|---|---|---|
| Flow rate of $Zr(BH_4)_4$ Gas [sccm] | 100 | 100 | 100 | 100 |
| Flow rate of $N_2$ Gas [sccm] | 100 | 100 | 100 | 100 |
| Flow rate of $NH_3$ Gas [sccm] | 0 | 0 | 0 | 0 |
| Flow rate of $H_2$ Gas [sccm] | 0 | 0 | 0 | 0 |
| Film Formation Time [min] | 2 | 2 | 2 | 2 |
| Film Formation Temperature [°] | 240 | 230 | 210 | 260 |
| Film Formation Pressure [Pa] | 700 | 700 | 700 | 700 |
| Microwave Output [W] | 500 | 500 | 500 | 500 |
| Underlayer Film | $SiO_2$ | $SiO_2$ | $SiO_2$ | $SiO_2$ |
| Film Thickness [nm] | 15 | 23 | 9 | 58 |
| Sheet Resistance [Ω/square] | ∞ | ∞ | ∞ | $4.21 \times 10^2$ |
| Specific Resistance [μΩcm] | ∞ | ∞ | ∞ | 2442 |

TABLE 4

|  | Ex. 2 | Com. Ex. 8 | Com. Ex. 9 | Com. Ex. 10 |
|---|---|---|---|---|
| Flow rate of $Zr(BH_4)_4$ Gas [sccm] | 100 | 100 | 100 | 100 |
| Flow rate of $N_2$ Gas [sccm] | 100 | 100 | 100 | 100 |
| Flow rate of $NH_3$ Gas [sccm] | 0 | 0 | 0 | 0 |
| Flow rate of $H_2$ Gas [sccm] | 0 | 0 | 0 | 0 |
| Film Formation Time [min] | 8 | 8 | 8 | 2 |
| Film Formation Temperature [°] | 240 | 240 | 240 | 240 |
| Film Formation Pressure [Pa] | 700 | 30 | 700 | 700 |
| Microwave Output [W] | 500 | 500 | 700 | 0 |
| Underlayer Film | $SiO_2$ | $SiO_2$ | $SiO_2$ | $SiO_2$ |
| Film Thickness [nm] | 45 | 7 | 27 | 49 |
| Sheet Resistance [Ω/square] | ∞ | ∞ | ∞ | $1.69 \times 10^2$ |
| Specific Resistance [μΩcm] | ∞ | ∞ | ∞ | 828 |

In table 2, it is apparent that the sheet resistance of the $ZrB_xN_y$ films of the third comparative example and the fourth comparative example is "∞" like the second example and that the $ZrB_xN_y$ film superimposed on the silicon dioxide film (insulation film) has high insulativeness. Therefore, the reaction system of the $Zr(BH_4)_4$ and the excited nitrogen gas ($N_2$ gas) has an underlayer selectivity for the resistivity of the $ZrB_xN_y$ film without greatly relying on the film formation time, and the range of the film formation condition may be expanded.

In table 3, it is apparent that the sheet resistance of the $ZrB_xN_y$ films in the fifth comparative example and the sixth comparative example is "∞" like the second example and that the $ZrB_xN_y$ film superimposed on the silicon dioxide film (insulation film) has high insulativeness. The seventh comparative example shows a sheet resistance lower than the second example although a film is formed on the silicon dioxide film. In other words, the $ZrB_xN_y$ film superimposed on the silicon dioxide film (insulation film) does not fully exhibit insulativeness.

In FIG. 9, in the seventh comparative example, nitrogen element (N) having a lower concentration than the concentration of boron element (B) is contained, and the concentration of nitrogen element is less than 30%. In other words, film formation under a condition in which the temperature is excessively raised lowers the concentration of nitrogen element retrieved in the $ZrB_xN_y$ film and becomes the cause of inhibiting the insulativeness of the $ZrB_xN_y$ film.

Therefore, the preferable film formation temperature is the temperature at which the $ZrB_xN_y$ film retrieves a sufficient amount of nitrogen element and at which various types of bonding contained in the $ZrB_xN_y$ film are stabilized by heat energy. In other words, a temperature range lower than 260° C., and preferably the temperature condition of 180° C. to 250° C. ensures the underlayer selectivity of the resistivity of the $ZrB_xN_y$ film and obtains the thermal stability of the $ZrB_xN_y$ film.

In table 4, it is apparent that the sheet resistance of the $ZrB_xN_y$ film of the eighth comparative example is "∞" like the second example, and that the $ZrB_xN_y$ film superimposed on the silicon dioxide film (insulation film) has high insulativeness. In other words, the $ZrB_xN_y$ films obtained by the film formation conditions of the first example and the second example exhibit the underlayer selectivity of the resistivity even when its film formation pressure becomes low.

Therefore, the reaction system of the $Zr(BH_4)_4$ and the excited nitrogen gas ($N_2$ gas) ensures a wide pressure range when forming the $ZrB_xN_y$ film that has underlayer selectivity and expands the range of the film formation condition.

In table 4, it is apparent that the sheet resistance of the $ZrB_xN_y$ film of the ninth comparative example is "∞" like the second example and that the $ZrB_xN_y$ film superimposed on the silicon dioxide film (insulation film) has high insulativeness. In the tenth comparative example, the sheet resistance is lower than the second example although a film is formed on the silicon dioxide film. In other words, the $ZrB_xN_y$ film superimposed on the silicon dioxide film (insulation film) does not fully exhibit insulativeness.

Accordingly, by using the excited nitrogen gas ($N_2$ gas) the concentration of nitrogen element retrieved in the $ZrB_xN_y$ film is increased, and the insulativeness may be induced with respect to the $ZrB_xN_y$ film.

The manufacturing apparatus and the manufacturing method of the semiconductor device 1 in the first embodiment has the advantages described below.

(1) The second interlayer insulation film 11 and first wire 13 or the second wire 34 and hard mask 32 are formed on the surface of the silicon substrate 2, and the silicon substrate 2 is transferred to the reaction chamber S. The $N_2$ gas excited by microwaves is drawn into the reaction chamber S. The $Zr(BH_4)_4$ accommodated in the supply tank T is bubbled by the Ar gas, and the Ar gas containing the $Zr(BH_4)_4$ is drawn into the reaction chamber S as the $Zr(BH_4)_4$ gas.

Accordingly, the first and second metal cap layers 16 and 37, formed from $ZrB_xN_y$ (x including zero), are generated by the reaction system of $Zr(BH_4)_4$ and the excited nitrogen gas ($N_2$ gas). As a result, the first and the second metal cap layers 16 and 37 have conductivity only at the region corresponding to the metal layer and avoids short circuiting between the adjacent metal layers irrespective of coarseness/denseness, surface area, shape, and the like of the underlayer metal layer. Furthermore, a complicated cleaning step is not necessary since the first and second metal cap layers 16 and 37 do not require film formation selectivity. A reaction system that avoids the generation of particles may be formed for the first and the second metal cap layers 16 and 37. This increases the reliability of the first and the second metal cap layers 16, 37 and the productivity thereby enhance.

(2) The microwave is irradiated on the $N_2$ gas at outside the reaction chamber S, and the excited $N_2$ gas is introduced into the reaction chamber S. Therefore, the excited $N_2$ gas is supplied by the amount necessary for reaction compared to when exciting the $N_2$ gas in the reaction chamber S. As a result, the reaction system by the $Zr(BH_4)_4$ and the excited $N_2$ gas is more stabilized. Furthermore, damages of the silicon substrate 2 are avoided when exciting the $N_2$ gas.

(3) The silicon substrate 2 is heated at 210° C. to 240° C. when forming the film of $ZrB_xN_y$. This further ensures the $ZrB_xN_y$ film has underlayer dependency with respect to the conductivity of the first and the second metal cap layers 16 37 and ensures thermally stability.

(Second Embodiment)

A second embodiment of a manufacturing method according to the present invention will now be discussed with reference to FIGS. 10 to 12. In the second embodiment, the film formation conditions of the $ZrB_xN_y$ film in the second embodiment is changed from the CVD process to the ALD process. The film formation condition of the $ZrB_xN_y$ film will now be described.

In the same manner as the first embodiment, the control unit 51 of the film formation device 40 receives the film formation condition data Id from the I/O unit 52. The control unit 51 drives the discharge pump 45 with the discharge system drive circuit 53 and depressurizes the reaction chamber S to a predetermined attainment pressure (e.g., 1 [Pa]). After depressurizing the reaction chamber S, the control unit 51 drives the transfer system with the transfer system drive circuit 54 and transfers silicon substrates 2 from the load lock chamber 40L to the film formation chamber 40D.

After raising the temperature of the silicon substrate 2 to a predetermined temperature, the control unit 51 drives the discharge system drive circuit 53, the mass flow controller drive circuit 55, and the microwave power supply drive circuit 56, and executes each processing step in correspondence with the film formation condition data Id.

Figure 10:
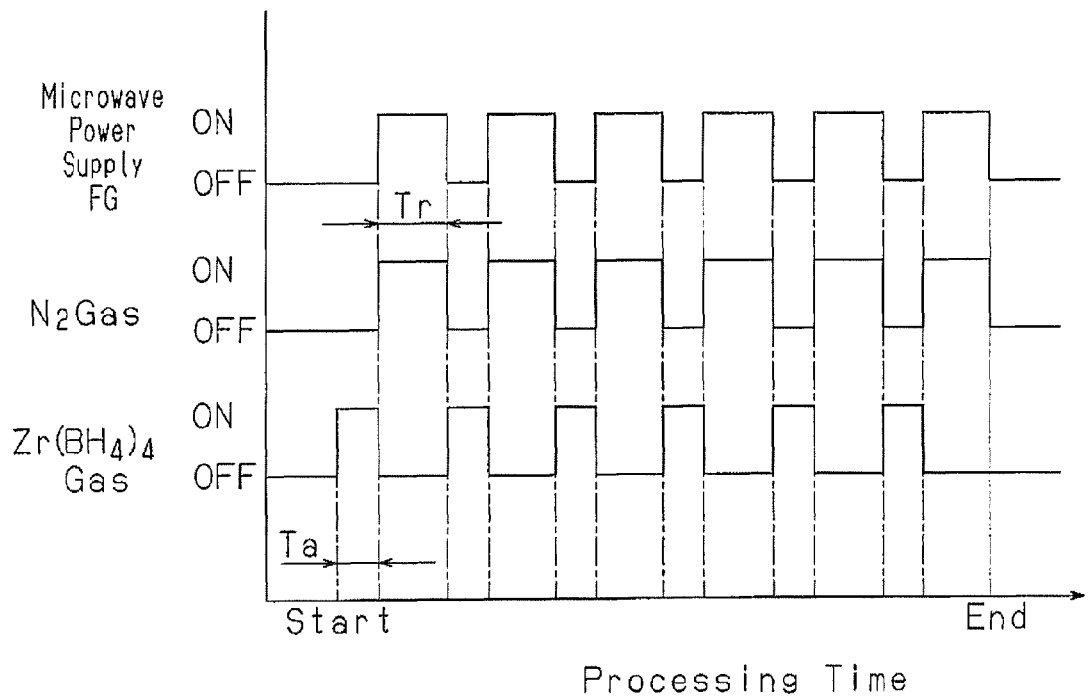
FIG. 10 is a timing chart showing a manufacturing process in a second embodiment.

In other words, in FIG. 10, the control unit 51 drives the mass flow controller MC1 with the mass flow controller drive circuit 55 when the film formation process starts, draws $Zr(BH_4)_4$ gas into the reaction chamber S at a predetermined flow rate, and starts the adsorption process. The control unit 51 supplies 100 [sccm] of Ar to the tank T with the mass flow controller MC1 and draws Ar gas containing $Zr(BH_4)_4$, that is, $Zr(BH_4)_4$ gas into the reaction chamber S.

The period in which the $Zr(BH_4)_4$ gas is drawn into the reaction chamber S is referred to as the adsorption period Ta. The adsorption period Ta is set in advance based on experiments and the like. Specifically, the adsorption period Ta is set to a period (e.g., one to five seconds) in which the $Zr(BH_4)_4$ (admolecules MA) forms a monomolecular layer over the entire surface of the silicon substrate 2.

Figure 11:
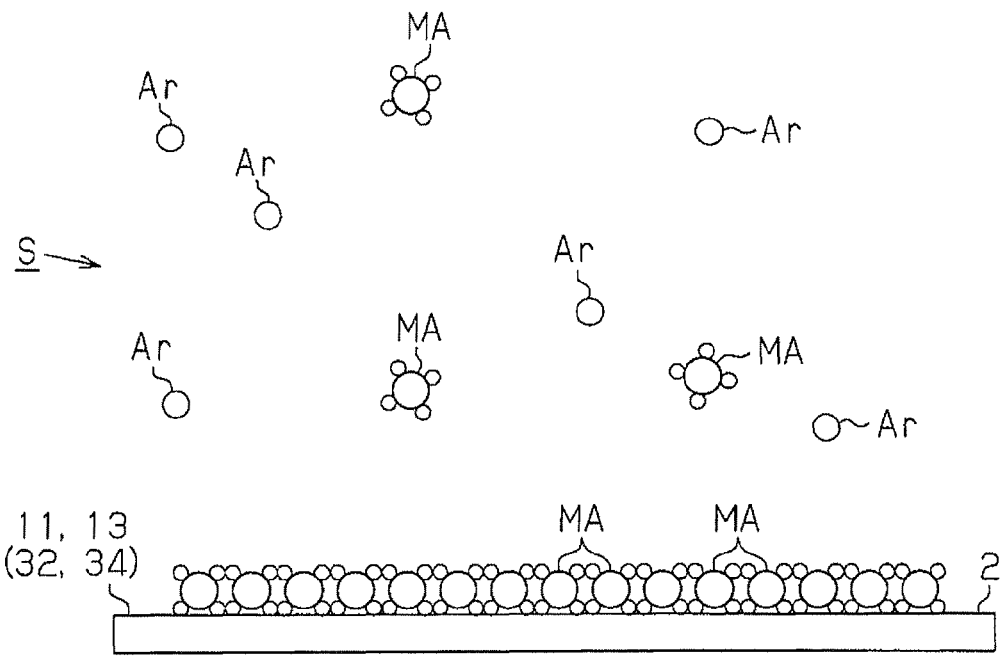
FIG. 11 is a process diagram showing an adsorption process in the second embodiment.

In FIG. 11, the $Zr(BH_4)_4$ (admolecules MA) received in the reaction chamber S is adsorbed in the surface of the silicon substrate 2 by the strong interaction with the surface. In other words, the $Zr(BH_4)_4$ functions as the admolecules MA that physically or chemically adsorb to the surface of the silicon substrate 2 and form the monomolecular layer over the entire surface.

In FIG. 10, the control unit 51 drives the mass flow controller MC1 with the mass flow controller drive circuit 55, stops the supply of the $Zr(BH_4)_4$ gas, and terminates the adsorption process when the processing time for drawing in the admolecules MA elapses by the adsorption period Ta.

After terminating the adsorption process, the control unit 51 drives the mass flow controller MC4 through the mass flow controller drive circuit 55 to supply the $N_2$ gas of a predetermined flow rate to the reaction chamber S. The control unit 51 then drives the microwave power supply FG through the microwave power supply drive circuit 56, supplies the excited $N_2$ gas to the reaction chamber S, and starts a reformation process.

The period in which the microwave is oscillated by the microwave source 48 is referred to as the reforming period Tr. The reforming period Tr is set in advance based on experiments and the like. Specifically, the reforming period Tr is set to a period (e.g., one second to ten seconds) in which the monomolecular layer of the admolecules MA is nitride to form a monomolecular film of $ZrB_xN_y$.

Figure 12:
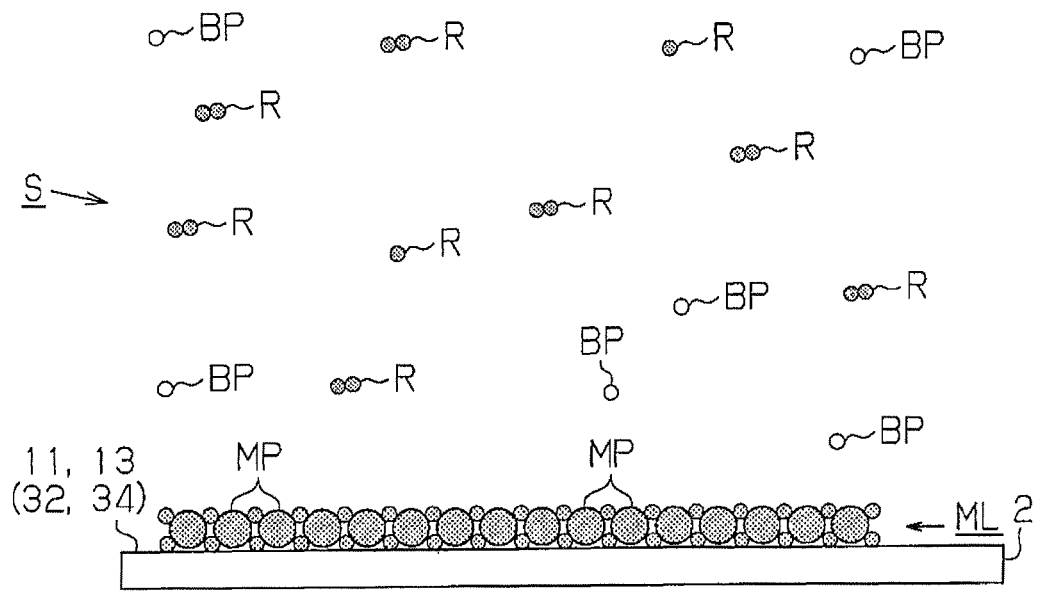
FIG. 12 is a process diagram showing a reformation process in the second embodiment.

In FIG. 12, the excited $N_2$ gas (reforming gas R) enhances the decomposition reaction of the $Zr(BH_4)_4$ (admolecules MA). Specifically, the reformed gas R generates decomposition products and by-products BP (e.g., borohydride) using all the admolecules MA adsorbed in the surface of the silicon substrate 2, enhances the nitride reaction of decomposition products, and generate a nitride MP. In other words, the excited $N_2$ gas (reformed gas R) generates a monomolecular film ML of $ZrB_xN_y$ over the entire surface of the silicon substrate 2.

In FIG. 10, the control unit 51 drives the mass flow controller MC4 through the mass flow controller drive circuit 55 to stop the supply of the $N_2$ gas when the reforming period Tr elapses during the processing for oscillating microwaves. Further, the control unit 51 stops the oscillation of microwaves with the microwave power supply drive circuit 56. That is, the reformation process is terminated.

After terminating the reformation process, the control unit 51 drives the mass flow controller MC1 again with the mass flow controller drive circuit 55 and sends the admolecules MA at a predetermined flow rate into the reaction chamber S. In other words, the adsorption process starts again. The control unit 51 alternately repeats the adsorption process and the reformation process in the same manner to sequentially superimpose the monomolecular film ML of nitride MP.

The film formation device 40 may then form the metal cap layers 16 and 37, the main component of which is $ZrB_xN_y$ (x including zero), as the main component by superimposing monomolecular films one at a time. This ensures that the information of the underlayer (i.e., whether or not the underlayer is a conductive film) is conveyed to the metal cap layers 16 and 37.

The manufacturing method in the second embodiment has the advantages described below.

(1) The $Zr(BH_4)_4$ gas is drawn into the reaction chamber S during the adsorption period Ta to form a monomolecular film of $Zr(BH_4)_4$ (admolecules MA) on the surface of the second interlayer insulation film 11 and surface of the first wire 13 or the surface of the hard mask 32 and surface of the second wire 34. After the adsorption period Ta elapses, the excited $N_2$ gas is drawn into the reaction chamber S during the reforming period Tr to form the monomolecular film ML of $ZrB_xN_y$ using the admolecules MA.

Accordingly, the metal cap layers 16 and 37, the main component of which is $ZrB_xN_y$, may be superimposed one monomolecular film at a time. This ensures that the information of the corresponding underlayer, that is, whether or not the underlayer is a conductive film, is conveyed to the metal cap layers 16 and 37. As a result, the metal cap layers 16 and 37 have conductivity only at the region corresponding to the first wire 13 and the second wire 34. This prevents short circuiting between the adjacent first wires 13 and the adjacent second wires 34.

The above-described embodiments may be practiced in the forms described below.

Figure 13:
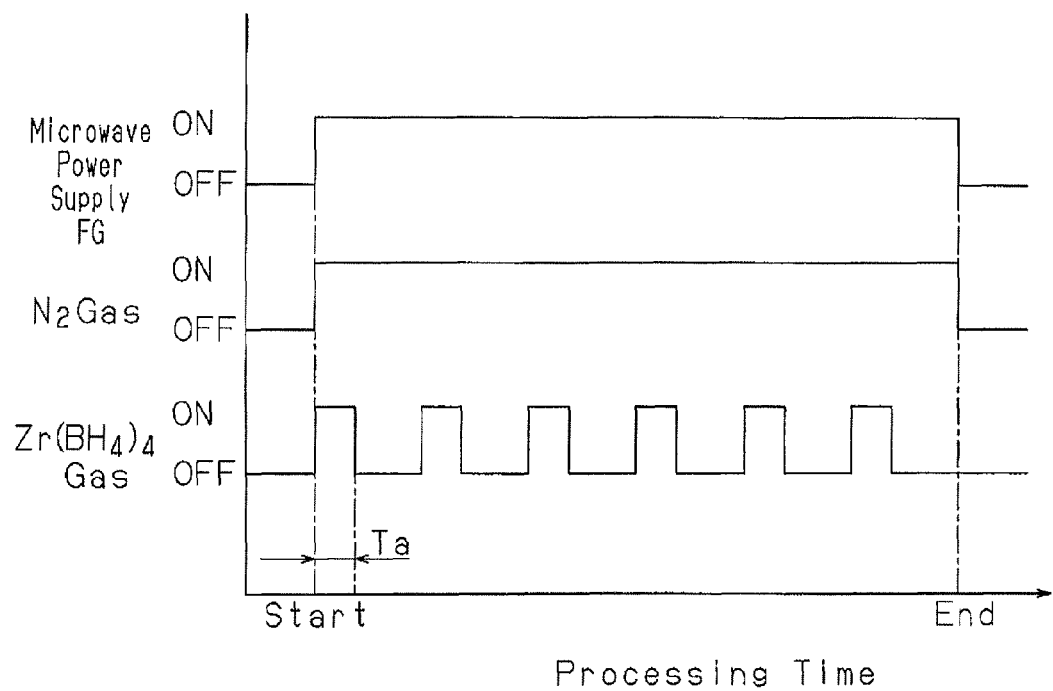
FIG. 13 is a timing chart showing a manufacturing process in a modification of the second embodiment.

(a) In the second embodiment, the excited $N_2$ gas is drawn in only during the period of the reformation process. The present invention is not limited in such a manner, and the excited $N_2$ gas may be drawn in during both the reformation process and the adsorption process, as shown in FIG. 13. In other words, the excited $N_2$ gas may be drawn in even when the admolecules MA are drawn in. With such a configuration, the gas phase reaction of the $Zr(BH_4)_4$ gas and the excited $N_2$ gas may be performed simultaneously with the adsorption reaction of the $Zr(BH_4)_4$. This ensures that the $Zr(BH_4)_4$ corresponding to the non-reacting part of the admolecules MA or the $Zr(BH_4)_4$ corresponding to the non-reacting part of the gas phase reaction becomes $ZrB_xN_y$. Thus, a further uniform Zr-N bond may be formed.

(b) In the first and the second embodiments, the metal layer is embodied in the first wire 13 and the second wire 34. The present invention is not limited in such a manner, and the metal layer may be embodied in an electrode of a capacity element or an inductance element.

(Method for Forming Barrier Film)

A method for forming a barrier film according to the present invention will now be discussed with reference to FIGS. 14 to 17.

The barrier film of the present invention forms a ZrBN film on the surface of a film formation subject including an insulation film having a hole and a trench (wire groove). Preferably, the formation step of the ZrBN film includes forming the ZrBN film by causing reaction of the $Zr(BH_4)_4$ gas (gas containing zirconium), which is a raw material gas, with gas obtained by exciting $N_2$ gas (gas containing nitrogen), which is a reactive gas, with an excitation means.

Figure 17A:
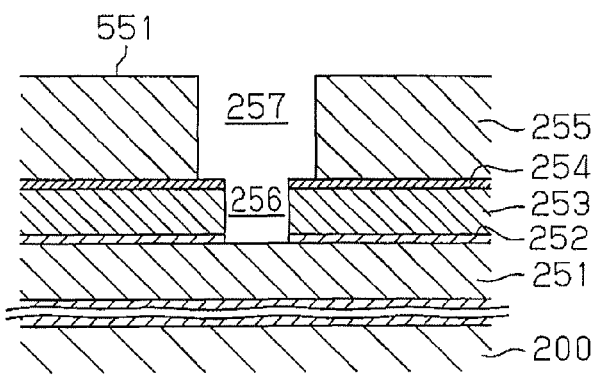
FIGS. 17(a), 17(b), 17(c), and 17(d) are cross-sectional views showing a fabrication process of the multilayer wiring structure according to the present invention.
Figure 18A:
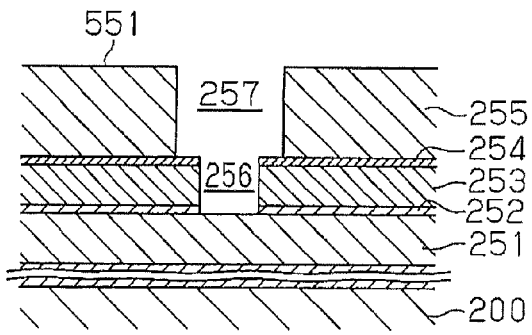
FIGS. 18(a), 18(b), 18(c), 18(d), and 18(e) are cross-sectional views describing a fabrication process of a multilayer wiring structure in the prior art.

In one example, the film formation subject is a substrate 200 including a hole 256 and a wire groove 257, as shown in FIG. 17(a) (in the same manner as FIG. 18(a)).

The method for forming a barrier film according to the present invention may be a CVD process (Chemical Vapor deposition) or a ALD (Atomic Layer deposition) process.

In the case of the CVD process, the raw material gas is obtained by supplying 10 to 2000 sccm of bubbling gas (e.g., Ar gas) for 200 g of $Zr(BH_4)_4$ in the form of powder. The flow rate of the reactive gas is preferably 10 to 2000 sccm. If the reactive gas is greater than 2000 sccm, the reactive gas easily deactivates when the reactive gas is excited by the excitation means, and if the reactive gas is less than 10 sccm, the reaction does not advance and a film cannot be formed.

In the case of the ALD process, which forms a film by repeating the adsorption process and the reaction process (also referred to as reformation process in the present specification) for several times to a several hundreds of times, the raw material gas in the adsorption process is obtained by supplying 10 to 2000 sccm of bubbling gas (e.g., Ar gas) for 200 g of $Zr(BH_4)_4$ in the form of powder. The flow rate of the reactive gas in the reaction process is preferably 10 to 2000 sccm. If the reactive gas is greater than 2000 sccm, the reactive gas is easily deactivated when the reactive gas is excited by the excitation means, and if the reactive gas is less than 10 sccm, the reaction does not advance and a film cannot be formed.

The excitation means may be of any means that excites the reactive gas. For example, plasma may be generated by a plasma excitation means, and the reactive gas may come into contact with the plasma to excite the reactive gas.

Figure 18E:
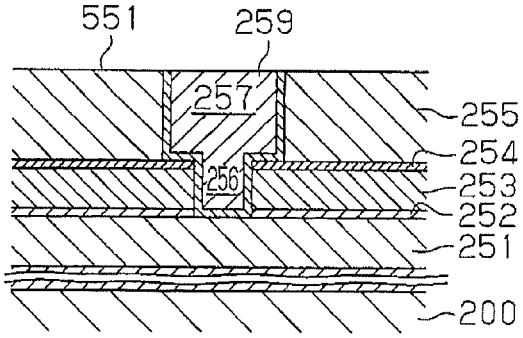
Figure 18B:
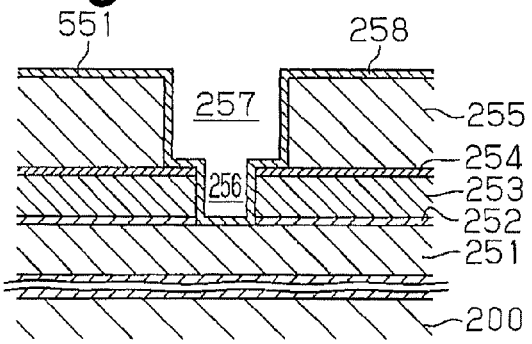
Figure 18C:
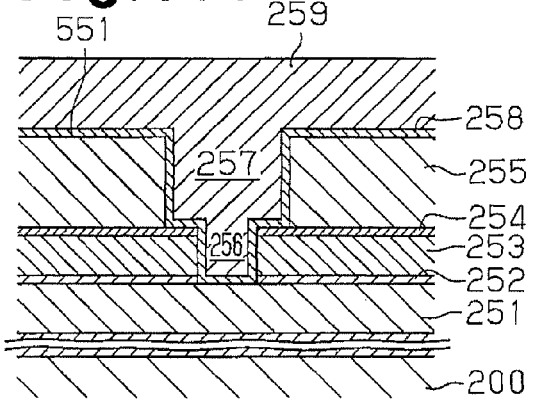
Figure 18D:
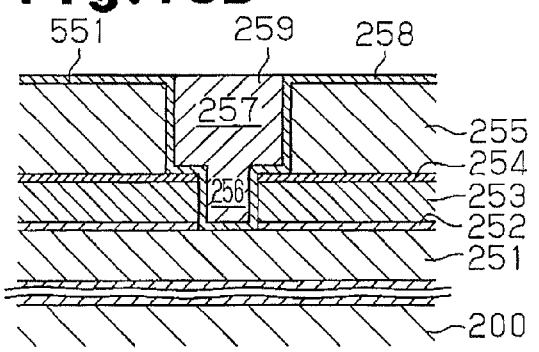

When the ZrBN film is formed through the CVD process or the ALD process, the ZrBN film formed on the conductive film has a conductive property, and the ZrBN film formed on the insulation film has an insulative property. In this case, the substrate temperature during film formation is preferably lower than 260° C. When in such a temperature range, the ZrBN film obtained by causing reaction of the $Zr(BH_4)_4$ gas with the $N_2$ gas, which is excited by the excitation means, has a selectivity in which the physical properties (i.e., conductivity or insulativeness) changes in correspondence with the underlayer. The barrier film does not need to be removed as shown in FIG. 18(e) when forming the multilayer wiring structure by using the ZrBN film as the barrier film.

One example of a film formation device for implementing the film formation method of the ZrBN film will now be described with reference to FIG. 14.

The film formation device includes a film formation chamber 72 having a top portion with a shower head structure 71. The film formation device preferably includes an excitation means for the reactive gas. The excitation means for the reactive gas may be a plasma excitation means using plasma, a catalytic excitation means using catalyst metal, or the like. In the film formation device shown in FIG. 14, the shower head structure 71 includes, for example, a plasma excitation means for generating plasma by supplying microwaves. The shower head structure 71 includes a coaxial resonance cavity 81 located at an upper part of the film formation device, a reactive gas intake chamber 82 arranged on the lower side of the coaxial resonance cavity 81, a shower head portion 83 arranged at the lower side of the reactive gas intake chamber 82, and a microwave supply means 84 connected to the cavity 81. The shower head structure 71 includes a reactive gas intake means 18 for drawing in the reactive gas, and a raw material gas intake means 86 for drawing in the raw material gas.

The coaxial resonance cavity 81 is formed from copper or aluminum. The coaxial resonance cavity 81 includes a non-metal pipe 111 extending through the top wall and the bottom wall of the cavity. A gas tube 151 of a reactive gas intake means 85 is connected to an upper end of the non-metal pipe 111. The gas tube 151 is connected to a gas source (not shown) by a flow rate control means 152. The gas intake means 85 preferably draws in not only the $N_2$ gas but also two or more gases depending on the process. For example, the gas tube 151 of the gas intake means 85 may be branched at the middle, and the flow rate control means 152 may be arranged in each of two or more gas tubes connected to separate gas sources (not shown), as shown in FIG. 14. In this case, two or more gases may be drawn in by each flow rate control means 152. A silica tube, a sapphire tube, or an alumina tube may be used as the non-metal pipe 111. However, it is preferable that a sapphire tube or alumina tube be used to further reduce particles.

A concentric upper conductor 112 is movably arranged at the upper part of the non-metal pipe 111 so as to surround the periphery of the non-metal pipe 111. The bottom wall of the coaxial resonance cavity 81 functions as a lower conductor 113 at the lower side of the upper conductor 112. An exposing portion 111a from which the non-metal pipe 111 is exposed is located between the two conductors 112 and 113, and microwaves are irradiated on the exposing portion 111a. In FIG. 14, the lower conductor 113 may be arranged at the bottom part of the coaxial resonance cavity 81 as a separate member instead of having the bottom wall of the coaxial resonance cavity 81 function as the lower conductor 113.

In order to generate plasma in the region of the exposing portion 111a of the non-metal pipe 111, a microwave supply means 84 is arranged at a position corresponding to the exposing portion 111a at the side wall surface of the coaxial resonance cavity 81. The microwave supply means 84 includes a magnetron 141 oscillating the microwave, a microwave power supply 142 for operating the magnetron 141, an antenna 143 connected to the magnetron 141 to supply microwaves having a resonance frequency (e.g., 2.45 GHz) and oscillated from the magnetron 141 to the coaxial resonance cavity 81, and a coaxial cable 144 for connecting the antenna 143 and the magnetron 141. When the microwave power supply 142 operates, microwaves are oscillated from the magnetron 141, and the microwaves reach the antenna 143, which is arranged on the wall surface of the cavity 81, through the coaxial cable 144. When the microwaves are provided from the antenna 143 into the coaxial resonance cavity 81, the reactive gas drawn from the upper part of the non-metal pipe 111 changes to a plasma state in the region of the exposing portion 111a, and the gas in the plasma state is supplied to the reactive gas intake chamber 82 from the lower part of the non-metal pipe 111, which is the flow passage of the gas. Thus, in the film formation device of FIG. 14, a waveguide for propagating the microwaves is not used. Thus, plasma is immediately generated when the microwaves are oscillated. In FIG. 14, the antenna 143 is not limited to one and two or more may be used. As described above, since the upper conductor 112 is movable, the position of the upper conductor 112 may be changed to vary the generation state of the electric field between the upper conductor 112 and the lower conductor 113 and alter the generation state of the plasma.

Generally, when plasma is generated in the plasma generation cavity, the electric field distribution of the plasma generation cavity changes, the resonance frequency changes, and the generation efficiency of the plasma decreases. In this case, a time lag occurs between the microwave oscillation and the plasma generation if the microwave supply means is adjusted.

Figure 14:
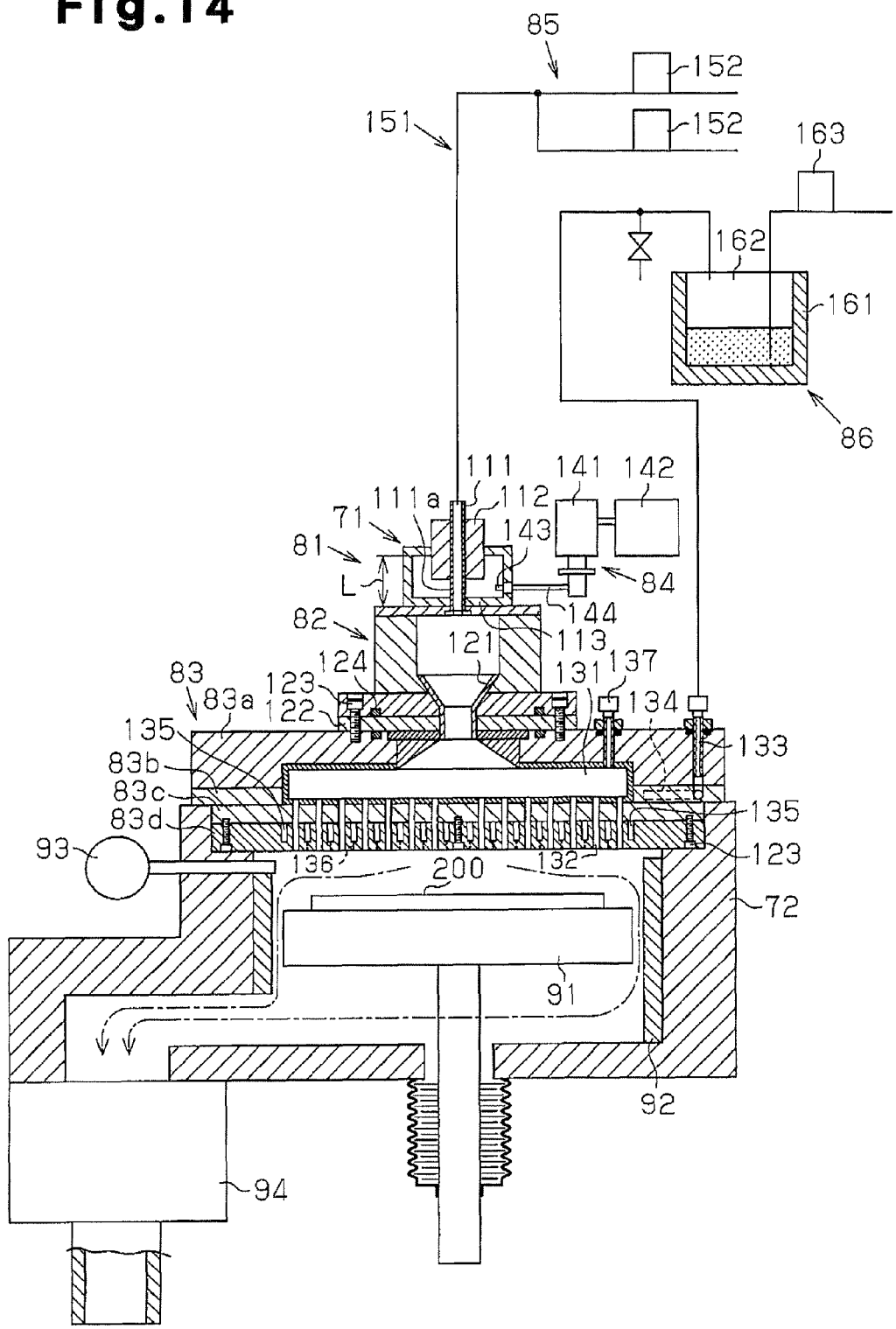
FIG. 14 is a schematic cross-sectional view showing shower head structure in a further film formation device according to the present invention.

In the film formation device of FIG. 14, the height L of the coaxial resonance cavity 81 is set to an integer multiple of $\lambda;2$ the excitation wavelength so that the resonance frequency does not change before and after the plasma generation. Specifically, the electrical field distribution of the coaxial resonance cavity 81 is in a TM mode before the plasma generation and in a TEM mode after the plasma generation. Therefore, each resonance frequency before and after the plasma generation is obtained from an electrical equivalent circuit in each mode, and the height L is calculated such that the resonance frequencies become equal. In the above-described configuration, changes in the resonance frequency may be suppressed before and after the plasma generation.

The frequency in the coaxial resonance cavity 81 may slightly fluctuates after the plasma generation even when the height L of the coaxial resonance cavity 81 is set. Thus, the microwave supply means 84 of the first shower head structure 71 preferably includes an excitation current control circuit. The control circuit monitors the frequency before and after the plasma generation in the coaxial resonance cavity 81. If the frequency changes, the control circuit supplies the current corresponding to the amount of change to an excitation coil (not shown) in the magnetron 141 as an excitation current to keep constant the wavelength of the microwaves.

When the microwaves are oscillated in a state in which the frequency of the coaxial resonance cavity 81 is changed, a reflective wave may be generated in the plasma generation chamber. Therefore, an anode voltage control circuit may be used to detect the reflective wave, superimpose and apply voltage corresponding to the phase difference between the detected reflective wave and the traveling wave of the oscillated microwave on an anode electrode of the magnetron 141, and adjust the frequency of the microwaves to the resonance frequency. In this case, the reflective waves are exchanged to heat in the microwave supply means. Thus, the anode voltage control circuit must be handled with case so that it is not damaged by the heat generated from the reflective waves. A choke structure corresponding to the length of one fourth of the oscillation waveform may be arranged in the lower conductor 113. This suppresses the microwaves that leak out of the exposing portion 111a.

In this manner, the shower head structure 71 oscillates a constant resonance frequency by setting the height L of the coaxial resonance cavity 81 to an integer multiple of $\lambda;2$ of the excitation wavelength. Furthermore, even if the resonance frequency is deviated before and after the plasma generation, the frequencies may be automatically matched by using the excitation current control circuit and the anode voltage control circuit. Furthermore, since the film formation device of FIG. 14 does not produce a time lag between the microwave oscillation and the plasma generation, the generation of the plasma may be suppressed in extremely short intervals such as 0.5 seconds.

The reactive gas excited by the plasma in the non-metal pipe 111 of the coaxial resonance cavity 81 is drawn into the shower head portion 83 through the reactive gas intake chamber 82. The reactive gas intake chamber 82 is formed from aluminum and the like, and a silica inner layer is preferably arranged on the inner wall to prevent generation of particles. In this case, as shown in FIG. 14, a silica inner layer 121 may be arranged at a lower region (shower head portion 83 side) of the inner wall in the gas intake chamber 82. The silica inner is preferably arranged on the entire inner wall surface of the gas intake chamber 82. The inner wall surface of the reactive gas intake chamber 82 may undergo an alumite treatment so that gas in the radical state resists deactivation.

The reactive gas intake chamber 82 may be cooled by a cooling means (not shown). A ceramic flange 122 (e.g., thickness 10 mm) is arranged between the reactive gas intake chamber 82 and the shower head portion 83 and fastened by fasteners 123 and 124. The ceramic flange 122 shields heat so that the reactive gas intake chamber 82 is not heated by the heat of the shower head portion 83. It is thus preferable that the ceramic flange 122 be alumina ceramic to ensure vacuum sealability, heat resistance, and heat shielding properties.

The shower head portion 83, which includes a disk-shaped member 83a, a ring-shaped member 83b, a first shower plate 83c, and a second shower plate 83d, and is properly fastened by a fastener tool 123. The disk-shaped member 83a preferably includes a heater and a thermocouple (not shown). The heater is configured to heat the shower head portion 83 to a predetermined temperature (e.g., about 150° C.), measure the heated temperature with the thermocouple, and monitor the temperature. The disk-shaped member 83a has an opening that is in communication with the reactive gas intake chamber 82. The opening of the disk-shaped member 83a and the opening of the ring-shaped member 83b form a reactive gas diffusion chamber 131. Reactive gas is drawn into and diffused in the reactive gas diffusion chamber 131. A silica inner layer is arranged on the entire inner wall of the reactive gas diffusion chamber 131, and a plurality of reactive gas ejection holes 132 are formed in the bottom surface. The reactive gas ejection hole 132 extends through the first shower plate 83c and the second shower plate 83d to the bottom surface of the shower head portion 83.

The disk-shaped member 83a also includes a raw material gas intake tube 133 connected to the raw material gas intake means 86. The raw material gas intake means 86 obtains raw material gas by arranging the raw material into the raw material tank 162, which is covered by a cooling jacket 161, and bubbling and sublimating the raw material with an inactive gas, such as Ar and N2, serving as the bubbling gas, while directly controlling the flow rate of the inactive gas using the mass flow controller 163 such as a low difference pressure mass flow controller. Such raw material gas is introduced to the raw material gas intake tube 133. If the raw material tank 162 is cooled and the temperature is maintained at 0° C. by the cooling jacket 161, the vapor pressure of the raw material gas is 3.7 mmHg. Thus, the chamber pressure becomes lower than 3.7 mmHg.

Figure 15A:
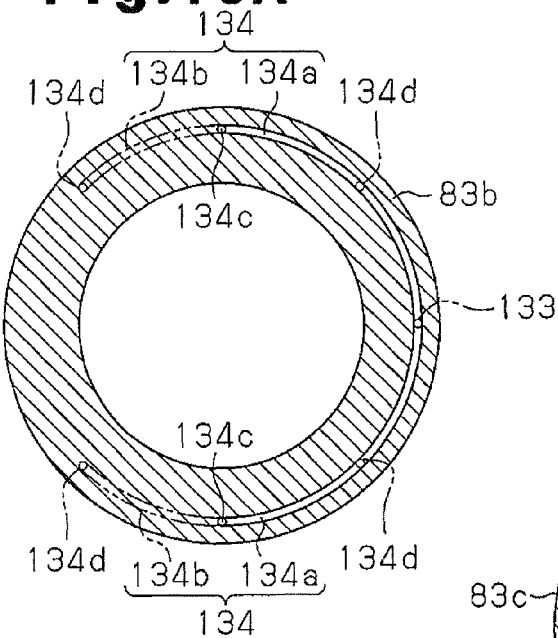
FIGS. 15(a), 15(b), and 15(c) are cross-sectional side views respectively showing a ring-shaped member, a first shower plate, and a second shower plate in the shower head structure of FIG. 14.
Figure 15B:
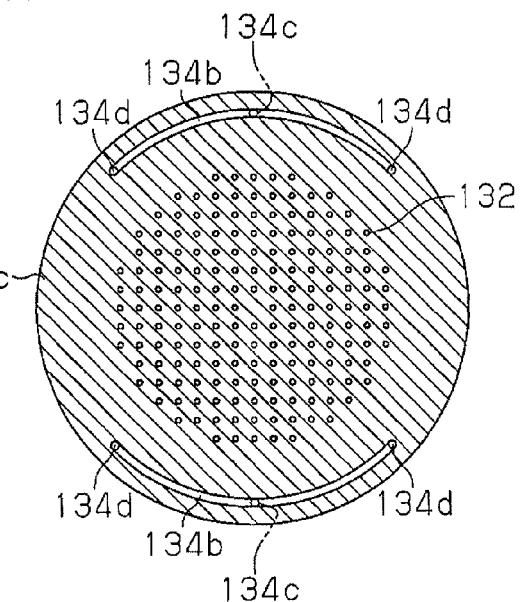
Figure 15C:
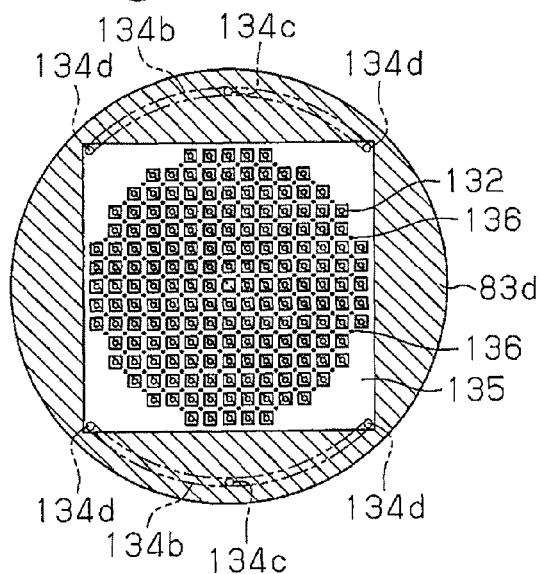
Figure 16:
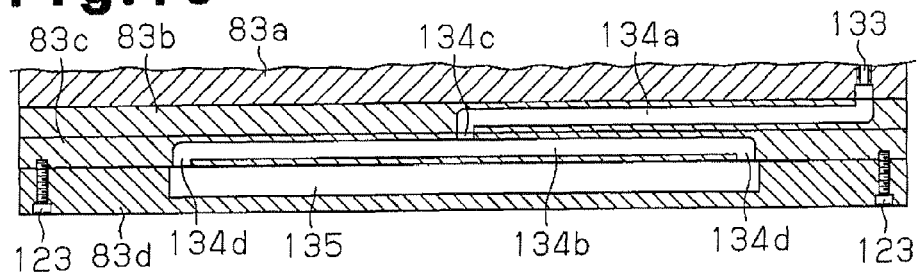
FIG. 16 is a cross-sectional view showing the positional relationship of a raw material gas intake tube, a gas passage, and a raw material gas diffusion chamber in the film formation device of FIG. 14.

The raw material gas intake tube 133 is connected to the raw material gas diffusion chamber 135 formed in the second shower plate 83d through a gas passage 134, that is, a gas passage 134a arranged at the peripheral part of the ring-shaped member 83b and a gas passage 134b arranged at the peripheral part of the first shower plate 83c, as shown in FIGS. 15(a) to 15(c). The gas passage 134 has one or more stages. Each stage includes gas passages, the quantity of which is represented by $2^{n-1}$ (n being the quantity of stages) (in FIG. 15, the gas passage 134a of the first stage and the gas passage 134b of the second stage). Furthermore, in a multiple stage structure, the gas passage 134 is formed so that that the distances from the location of a first connection hole, which connects the raw material gas intake tube 133 and the gas passage 134a of the first stage, to the locations of a plurality of second connection holes, which connect the gas passage 134b of the last stage to the raw material gas diffusion chamber 135, are all equal. The gas passage 134 will now be described in detail with reference to FIGS. 15 and 16. FIGS. 15(a) to 15(c) are cross-sectional side views showing the ring-shaped member 83b, the first shower plate 83c, and the second shower plate 83d, respectively. FIG. 16 is a cross-sectional view showing the position relationship of the raw material gas intake tube 133, the gas passage 134, and the raw material gas diffusion chamber 135.

The gas passage 134 includes an arcuate gas passage 134a in the ring-shaped member 83b and two arcuate gas passages 134b in the first shower plate 83c. The two gas passages 134b are arranged in the peripheral part of the region of the first shower plate 83c, which includes the reactive gas ejection hole 132. The gas intake tube 133 is connected to an upper middle part of the gas passage 134a. A connection hole 134c is formed in the bottom part of the two ends of the gas passage 134a. The two connection holes 134c are connected to the upper part at the middle of the two gas passages 134b formed in the first shower plate 83c. Accordingly, the gas passage 134a is in communication with the gas passages 134b.

Further, a connection hole 134d is formed in the bottom part of the two ends of each gas passage 134b. The connection hole 134d (i.e., four connection holes 134d) of the gas passage 134b are connected to the upper part at four corners of the raw material gas diffusion chamber 135 arranged in the second shower plate 83d. Therefore, raw material gas is evenly discharged to the raw material gas diffusion chamber 135 through the connection holes 134d.

The gas passage 134 for connecting the raw material gas diffusion chamber 135 and the raw material gas intake tube 133 has a two-stage structure. In other words, the gas passage 134a of the first stage and the gas passage 134b of the second stage are formed as a single gas flow passage for guiding the raw material gas from the raw material gas intake tube 133 to the raw material gas diffusion chamber 135. In the gas passage 134, the distances from the raw material gas intake tube 133 to the four connection holes 134d are all equal. Thus, the raw material gas of the same amount simultaneously reaches the raw material gas diffusion chamber 135 through the four connection holes 134d. Accordingly, the raw material gas may be evenly diffused to the raw material gas diffusion chamber 135. In FIG. 15, the gas passage is not limited to the gas passage 134 having a two-stage structure and may have a structure with three or more stages. The number of connection holes 134d in the gas passage of the last stage is not limited to four and may be five or more. For instance, a third shower plate including the reactive gas ejection hole 132 in the same manner as the first shower plate 83c and four gas passages may be arranged between the first shower plate 83c and the second shower plate 83d. Each connection hole 134d of the first shower plate 83c is connected to the upper middle part of each of the fourth gas passages in the third shower plate. Furthermore, a connection hole, which is in communication with the raw material gas diffusion chamber 135 of the second shower plate 83d, may be formed at the two ends of each gas passage in the third shower plate. In other words, the third shower plate includes eight connection holes. In this case, the shape of the raw material gas diffusion chamber 135 is designed in accordance with the positions of the eight connection holes so that the raw material gas is further evenly diffused into the raw material gas diffusion chamber 135. Furthermore, the raw material gas diffusion chamber 135 has a square shape in FIG. 15 but may have a circular shape or another polygonal shape.

As shown in FIG. 15(c), the raw material gas diffusion chamber 135 includes a plurality of raw material gas ejection holes 136. The raw material gas ejection holes 136 extend through the bottom surface of the shower head portion 83. In this case, the conductance of the ejection hole 136 is preferably reduced such that the raw material gas is evenly ejected into the vacuum chamber (reaction chamber). In the film formation device shown in FIGS. 14 and 15, the raw material gas is evenly supplied into the vacuum chamber with the raw material gas ejection hole 136 having a hole diameter Φ of about 0.7 to 1 mm and a hole depth of about 10 MM.

The reactive gas ejection hole 132 extends to the bottom surface of the shower head portion 83. The reactive gas ejection hole 132 and the raw material gas ejection holes 136 are arranged in a matrix at the bottom surface of the shower head portion 83 at constant intervals. Thus, the raw material gas and the reactive gas are irradiated on the substrate without deviations. The distance between the centers of the raw material gas ejection holes 136 and the distance between the centers of the reactive gas ejection holes 132 are set to be the same (e.g., 14 mm). In this case, the diameter of the reactive gas ejection hole 132 is greater than the diameter of the raw material gas ejection hole 136. For example, if the diameter of the raw material gas ejection hole 136 is 1 mm, the diameter of the reactive gas ejection hole 132 is 5 mm.

In the shower head portion 83, the reactive gas drawn from the reactive gas intake means 85 to the shower head portion 83 through the non-metal pipe 111 and the reactive gas intake chamber 82 spreads throughout the entire reactive gas diffusion chamber 131 and is supplied into the film formation chamber 72 (reaction chamber) through each reactive gas ejection hole 132. The raw material gas drawn from the raw material gas intake tube 133 is drawn into the gas passage 134 from the central part of the gas passage 134a and equally diffused to the right and left in the gas passage 134a. The raw material gas is then drawn into the two gas passages 134b of the lower stage through two connection holes 134c and equally diffused to the right and left in each gas passage 134b. Finally, the raw material gas is evenly diffused to the raw material gas diffusion chamber 135 from the four connection holes 134d and evenly supplied into the film formation chamber 72 from each raw material gas ejection hole 136 at the bottom surface of the raw material gas diffusion chamber 135.

As shown in FIG. 14, a substrate stage 91 for holding the substrate 200 is arranged in a freely rising/lowering manner at a position facing toward the shower head structure 71 of the film formation chamber 72. The stage 91 includes a heating means (not shown) capable of heating the substrate 200 mounted on the stage 91 to a predetermined temperature. A shield 92 is arranged at the side wall of the film formation chamber 72 to prevent the raw material gas from attaching to the inner wall surface of the film formation chamber 72 and generating particles. A pressure gauge 93 for measuring the pressure in the film formation chamber 72 during film formation is also arranged at the side wall of the film formation chamber 72. A turbo molecular pump 94 is arranged at the bottom of the film formation chamber 72. The turbo molecular pump 94 is capable of discharging gas out of the film formation chamber 72 from the bottom The inner side of the non-metal pipe 111 may be etched when many substrates are processed for film formation with the film formation device shown in FIG. 14. In order to suppress such etching, the film formation device preferably includes a cooling gas intake means for cooling the interior of the coaxial resonance cavity 81. In this case, the non-metal pipe 111 is preferably a double-pipe formed from a non-metal (e.g., alumina or silica) and having a flow passage through which a cooling fluid flows.

In this case, the cooling fluid must be a fluid medium that does not resonate at the oscillation frequency of the microwaves. When the oscillation frequency is 2.45 GHz, products that may be used as the cooling fluid include FC-87, FC-72, FC-84, FC-77, FC-75, FC-3283, FC-40, FC-43, FC-70, FC-5312, which are manufactured by 3M Co. and have a product name of FLUORINERT (registered trademark); and GALDEN (registered trademark), which is a product name and manufactured by Ausimont Societa Per Azioni. Ethylene glycol or a liquid medium of which main component is ethylene glycol may also be used. Further, a gas such as dry $N_2$ gas, dry Ar gas, dry He gas, and dry $O_2$ gas may also be used.

A device that uses a plasma generation means has been described above. However, a flow passage for reactive gas may include a wire formed from catalyst metal connected to the heating means. In this case, the reactive gas comes into contact with the heated wire to excite the reactive gas. The plasma generation means is described above as being arranged in the shower head structure 71. However, plasma may be generated in the film formation chamber 72, and the reactive gas may be changed to a plasma state in the film formation chamber 72.

The CVD process using the film formation device shown in FIG. 14 will now be discussed.

The substrate 200 is held on the stage 91, and the substrate 200 is heated on the stage 91 by a heating means (not shown) arranged in the stage 91. The temperature of the stage 91 is set to be lower than 260° C. The pressure valve of the turbo molecular pump 94 is adjusted to raise the pressure in the film formation chamber 72 to 400 Pa, which is held for a few minutes, while drawing in 200 sccm of hydrogen gas from the reactive gas intake means 85. When the pressure is raised and held in this manner, if the substrate 200 is sufficiently heated and the substrate temperature is set to be higher than or equal to 200° C., the surface of a first Cu film 251 (FIG. 17(a)) may be reduced. In this case, it is preferable that the temperature be higher than or equal to 250° C.

After heating the substrate 200 at a set temperature of lower than 260° C., and preferably 200 to 250° C., the supply of hydrogen gas is stopped, and the hydrogen gas is discharged from the film formation chamber 72. In this case, the substrate temperature is lower than the set temperature by a several degrees centigrade to several tens of degrees centigrade. The pressure in the film formation chamber 72 is then set to 700 Pa, and the $N_2$ gas serving as the reactive gas is drawn in from the reactive gas intake means 85 to the non-metal pipe 111 (or double pipe) under the conditions of 10 to 2000 sccm. At the same time, microwaves are oscillated from the magnetron 141 with the input power between 0.1 and 5 kW (preferably 0.5 kW) by the microwave supply means 84. The microwaves reach the antenna 143 through the coaxial cable 144 and enter the coaxial resonance cavity 81. As a result, the $N_2$ gas changes to a plasma state in the region of the exposing portion 111a, and the $N_2$ gas in the plasma state is supplied to the reactive gas intake chamber 82.

Subsequently, 100 sccm of Ar gas, or bubbling gas, is drawn into the raw material tank 162 for 200 g of raw material $Zr(BH_4)_4$. The $Zr(BH_4)_4$ gas, that is, the raw material gas obtained by bubbling the raw material with the Ar gas, is then drawn from the raw material gas intake tube 133 to the film formation chamber 72. After performing film formation for a predetermined film formation time (e.g., two minutes), the supply of the raw material gas is stopped. Then, the supply of the microwaves is stopped, the supply of the $N_2$ gas is stopped, and the gas is discharged from the film formation chamber 72.

The ALD process is performed in the same manner as the CVD process except in that the reactive gas (reformed gas) and the raw material gas are supplied at alternate timings. Specifically, the adsorption process is first carried out after setting the pressure in the film formation chamber 72 to 700 Pa. In the adsorption process, 100 sccm of Ar gas, or bubbling gas, is drawn into the raw material tank 162 for 200 g of raw material $Zr(BH_4)_4$. The $Zr(BH_4)_4$ gas, that is, the raw material gas obtained by bubbling the raw material with the Ar gas, is then drawn from the raw material gas intake tube 133 into the film formation chamber 72. The adsorption process is then performed for a predetermined time to adsorb the raw material $Zr(BH_4)_4$ to the film formation subject, and the supply of the raw material gas is stopped. Then, the reaction process (reformation process) is performed. In the reaction process, the $N_2$ gas serving as the reactive gas is introduced from the reactive gas intake means 85 to the non-metal pipe 111 (or double pipe) under the condition of 10 to 2000 sccm. At the same time, microwaves are oscillated from the magnetron 141 with the input power of 0.1 to 5 kW (preferably 0.5 kW) by the microwave supply means 84. The microwaves reach the antenna 143 through the coaxial cable 144 and enter the coaxial resonance cavity 81. As a result, the $N_2$ gas changes to a plasma state in the region of the exposing portion 111a, and the $N_2$ gas in the plasma state is supplied to the reactive gas intake chamber 82. Then, the supply of the microwaves is stopped, and the supply of the $N_2$ gas is stopped. The adsorption process is performed again, and the adsorption process and the reaction process are repeated until the ZrBN film becomes a desired thickness. In the above description, the supply of the microwaves is stopped for each reaction process, but the microwaves may be continuously supplied throughout the adsorption process and the reaction process. In this case, the ZrBN film also exhibits a conductive property at the portion formed on the conductive material, and the ZrBN film exhibits and insulative property at the portion formed on the insulative material.

A multilayer wiring structure using the ZrBN film as a barrier film will now be described with reference to FIG. 17. FIGS. 17(a) to 17(d) are cross-sectional views of the multilayer wiring structure illustrating the fabrication process of the multilayer wiring structure. The same reference numbers are used for components that are the same as those shown in FIGS. 18(a) to 18(e).

Figure 17B:
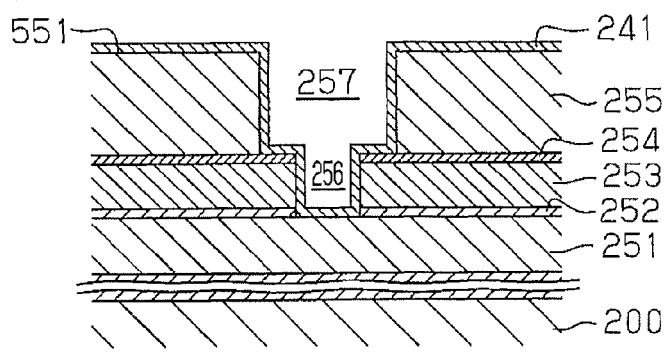

First, as shown in FIG. 17(b), the ZrBN film 241 is formed as a barrier film with a thickness of 3 to 20 nm through the CVD process or the ALD process on the film formation subject shown in FIG. 17(a) (same as that shown in FIG. 18(a)).

Figure 17C:
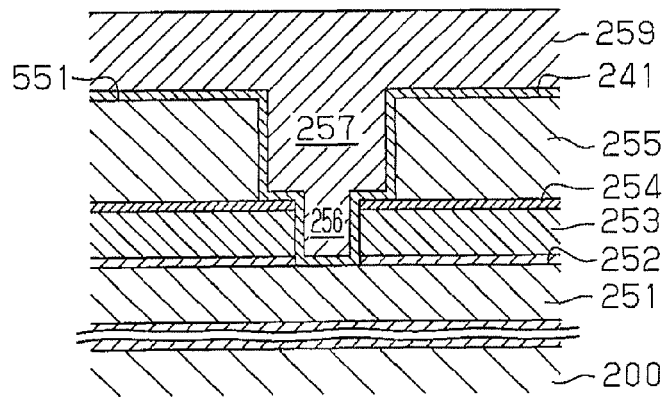
Figure 17D:
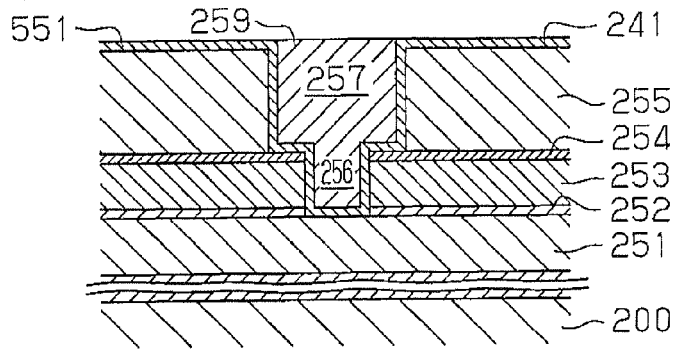

Subsequently, as shown in FIG. 17(c), a Cu wiring layer 259 is formed to fill a hole 256 and a wire groove 257 formed with the ZrBN film and to cover a flat portion 551 of a second silicon dioxide film 255 through an electroplating process or the like. As shown in FIG. 17(d), a surface planarization process is performed on the surface of the Cu film 259 through CMP to polish the excessive Cu wiring material above the wire groove 257 left out of the wire groove 257. The ZrBN film 241 does not need to be removed. Therefore, the multilayer wiring structure of the present invention may be fabricated more easily than when using the conventional Ta film as the barrier film. The performance is less likely to decrease with the obtained multilayer wiring structure since the barrier film does not remain on the insulation film.

The physical properties of the barrier film (ZrBN film) of the present invention will now be discussed using experimental examples.

First Experimental Example

For example, 100 sccm of Ar gas was drawn into the raw material tank 162 for 200g of raw material $Zr(BH_4)_4$. The raw material was bubbled with the Ar gas to obtain $Zr(BH_4)_4$ gas, that is, the raw material gas. The microwave power was set to 500 W, and the film formation pressure was set to 700 Pa. The other conditions were set as C1 to C5 conditions, which are shown below, to form the ZrBN film on the $SiO_2$ film. The film thickness of the ZrBN film was checked with the SEM, and the sheet resistance and the specific resistance were measured. In the conditions shown below, $H_2$ gas, $N_2$ gas and $NH_3$ gas are reactive gases.

C1 condition: 100 sccm of $H_2$ gas, film formation time of two minutes, stage temperature of 240° C.

C2 condition: 100 sccm of $N_2$ gas, film formation time of two minutes, stage temperature of 260° C.

C3 condition: 100 sccm of $NH_3$ gas, film formation time of two minutes, stage temperature of 240° C.

C4 condition: 100 sccm of $N_2$ gas, film formation time of eight minutes, stage temperature of 240° C.

C5 condition: 100 sccm of $N_2$ gas, film formation time of two minutes, stage temperature of 240° C.

C6 condition: 100 sccm of $N_2$ gas, film formation time of eight minutes, stage temperature of 210° C.

C7 condition: 100 sccm of $N_2$ gas, film formation time of eight minutes, stage temperature of 230° C.

The results are shown in table 5. The units that are used are nm for the film thickness, Ω/square for the sheet resistance, and μΩcm for the specific resistance.

TABLE 5

|  | Con. C1 | Con. C2 | Con. C3 | Con. C4 | Con. C5 | Con. C6 | Con. C7 |
|---|---|---|---|---|---|---|---|
| Underlayer Film | $SiO_2$ | $SiO_2$ | $SiO_2$ | $SiO_2$ | $SiO_2$ | $SiO_2$ | $SiO_2$ |
| Film Thickness | 45 | 58 | 50 | 45 | 15 | 9 | 23 |
| Sheet Resistance | 2.4E2 | 4.2E2 | 2.3E2 | ∞ | ∞ | ∞ | ∞ |
| Specific Resistance | 1067 | 2442 | 1140 | ∞ | ∞ | ∞ | ∞ |

Second Experimental Example

The ZrBN film was formed on the Cu film with the same conditions as the conditions C4 and C7 in the first experimental example. These conditions are shown as conditions C8 and C9. The film thickness of the obtained ZrBN film was checked with the SEM, and the sheet resistance and the specific resistance of the obtained ZrBN film were measured. The results are shown in table 6.

TABLE 6

|  | Condition C8 | Condition C9 |
|---|---|---|
| Underlayer Film | Cu | Cu |
| Film Thickness | 29 | 9 |
| Sheet Resistance | 6.1 | 9.5 |
| Specific Resistance | 17.6 | 8.6 |

When comparing the conditions C4 and C7 of the first experimental example and the conditions C8 and C9 of the second experimental example, it is apparent that the physical properties of the ZrBN film changed in accordance with the underlayer. In other words, the ZrBN film functions as insulation film if the underlayer film is the $SiO_2$ film, which is an insulator, and the ZrBN film functions as a conductive film if the underlayer film is the Cu film, which is conductive. It is also apparent from condition C6 that the selectivity of such ZrBN film does not depend on the film thickness. Furthermore, it is apparent from condition C2 that such selectivity is not obtained if the temperature becomes 260° C. Moreover, it is apparent from conditions C1 and C3 that such selectivity is not obtained in gases other than the $N_2$ gas.

Third Experimental Example

The composition of the ZrBN film formed under condition C4 of the first experimental example and condition C8 of the second experimental example was checked through an Auger analysis. The results are shown in table 7.

TABLE 7

|  | Condition C4 | Condition C8 |
| --- | --- | --- |
| Underlayer Film | Cu | SiO$_2$ |
| B | 19% | 18% |
| N | 44% | 45% |
| Zr | 37% | 37% |

From table 7, it was confirmed that the composition of the obtained ZrBN film was the same, and the component was not changed by the underlayer film.

The method for forming the barrier film according to the present invention has the advantages described below.

(1) The ZrBN film 241 that functions as a barrier film is formed on the surface of the film formation subject through the CVD process or the ALD process The ZrBN film 241 exhibits an insulative property on the insulation film (oxide silicon film 255) and exhibits a conductive property on the conductive film (Cu film 259). Therefore, the ZrBN film 241 does not need to be removed. This differs from the Ta barrier film of the related art. As a result, the characteristics of the semiconductor are prevented from being deteriorated by the removal of the barrier film. Thus, the ZrBN film 241 is useful particularly in the semiconductor technique.

(2) The ZrBN film 241 is formed while heating the substrate 200 at a temperature that is lower than 260° C. Under such a temperature condition, the ZrBN film 241 that is formed on the insulation film has insulativeness.

(3) The ZrBN film 241 does not need to be removed after filling the hole 256 and the wire groove 257 with the Cu film 259. Thus, the fabrication process of the multilayer wiring structure is shortened compared to when using the Ta film of the prior art as the barrier film.

The ZrBN film 241 shown in FIG. 17 may be generated by the film formation device (40D) shown in FIG. 3 in place of the film formation device shown in FIG. 14. In the same manner, the metal cap layers 16 and 37 shown in FIG. 1 may be generated by the film formation device shown in FIG. 14 in lieu of the film formation device (40D) shown in FIG. 3.

We claim:

1. A method for forming a barrier film in a reaction chamber comprising:
    exciting a gas containing nitrogen with a microwave outside the reaction chamber; and
    forming a ZrBN film as the barrier film by supplying a gas containing zirconium and the excited gas containing nitrogen to the reaction chamber, wherein the forming a ZrBN film includes forming the ZrBN film on a surface of a film formation subject including an insulation film, in which the insulation film includes a hole and a wire groove, wherein the ZrBN film is formed on an inner surface of each of the hole and the wire groove and on the insulation film.

2. The method for forming a barrier film according to claim 1, wherein said forming a ZrBN film includes forming the ZrBN film through a CVD process using the gas containing zirconium and the excited gas containing nitrogen.

3. The method for forming a barrier film according to claim 1, wherein said forming a ZrBN film includes forming the ZrBN film through an atomic layer deposition process that repeats an adsorption process using only the gas containing zirconium and a reaction process using only the excited gas containing nitrogen.

4. The method for forming a barrier film according to claim 1, wherein:
    the film formation subject is a substrate held on a stage; and
    said forming a ZrBN film includes forming the ZrBN film while heating the substrate on the stage at a set temperature of lower than 260° C.

5. A method for fabricating a multilayer wiring structure comprising:
    superimposing at least a wiring film, a cap layer, a first insulation film, and a second insulation film in this order on a film formation subject;
    forming a hole, which connects to the wiring film, and a wire groove from a surface of the second insulation film to the hole;
    forming a ZrBN film as a barrier film on an inner surface of each of the hole and the wire groove and on the second insulation film; and
    embedding a copper wire in the hole and the wire groove that include the ZrBN film,
    wherein the forming a ZrBN film includes:
        exciting a gas containing nitrogen with a microwave outside a reaction chamber; and
        forming the ZrBN film by supplying a gas containing zirconium and the excited gas containing nitrogen to the reaction chamber.

6. The method for fabricating a multilayer wiring structure according to claim 5, wherein said forming a ZrBN film includes forming the ZrBN film through a CVD process using the gas containing zirconium and the excited gas containing nitrogen.

7. The method for fabricating a multilayer wiring structure according to claim 5, wherein said forming a ZrBN film includes forming the ZrBN film through an atomic layer deposition process that repeats an adsorption process using only the gas containing zirconium and a reaction process using only the excited gas containing nitrogen.

8. The method for fabricating a multilayer wiring structure according to claim 5, wherein:
    the film formation subject is a substrate held on a stage; and
    said forming a ZrBN film includes forming the ZrBN film while heating the substrate on the stage at a set temperature of lower than 260° C.

* * * * *